(12) United States Patent
Kalkanoglu et al.

(10) Patent No.: US 8,793,940 B2
(45) Date of Patent: *Aug. 5, 2014

(54) ROOFING PRODUCTS, PHOTOVOLTAIC ROOFING ELEMENTS AND SYSTEMS USING THEM

(75) Inventors: Husnu M. Kalkanoglu, Swarthmore, PA (US); Gregory F. Jacobs, Oreland, PA (US); Peter Chihlas, Lansdale, PA (US)

(73) Assignee: CertainTeed Corporation, Valley Forge, PA (US)

( * ) Notice: Subject to any disclaimer, the term of this patent is extended or adjusted under 35 U.S.C. 154(b) by 757 days.

This patent is subject to a terminal disclaimer.

(21) Appl. No.: 12/853,972

(22) Filed: Aug. 10, 2010

(65) Prior Publication Data

US 2011/0030761 A1    Feb. 10, 2011

Related U.S. Application Data

(60) Provisional application No. 61/232,739, filed on Aug. 10, 2009.

(51) Int. Cl.
*E04D 13/18*    (2014.01)
*E04H 14/00*    (2006.01)

(52) U.S. Cl.
USPC ........... 52/173.3; 52/518; 52/748.1; 136/243; 428/343

(58) Field of Classification Search
USPC .............. 52/173.3, 518, 748.1; 136/243–293; 428/343
See application file for complete search history.

(56) References Cited

U.S. PATENT DOCUMENTS

| | | | | |
|---|---|---|---|---|
| 4,040,867 A * | 8/1977 | Forestieri et al. | ............. | 136/244 |
| 4,860,509 A | 8/1989 | Laaly et al. | | |
| 5,575,861 A * | 11/1996 | Younan et al. | ................ | 136/251 |
| 5,990,414 A * | 11/1999 | Posnansky | .................... | 136/244 |
| 6,174,403 B1 * | 1/2001 | Steiner et al. | ................. | 156/260 |
| 6,291,761 B1 * | 9/2001 | Takada et al. | ................. | 136/244 |
| 6,553,729 B1 * | 4/2003 | Nath et al. | .................. | 52/173.3 |
| 6,729,081 B2 * | 5/2004 | Nath et al. | .................. | 52/173.3 |
| 6,933,037 B2 * | 8/2005 | McCumber et al. | ......... | 428/143 |
| 8,312,693 B2 * | 11/2012 | Cappelli | ..................... | 52/748.1 |
| 2001/0054262 A1 | 12/2001 | Nath et al. | | |

(Continued)

FOREIGN PATENT DOCUMENTS

GB    2438526 A    11/2007
WO    2006121433 A1    11/2006

(Continued)

*Primary Examiner* — Brian Glessner
*Assistant Examiner* — Brian D Mattei
(74) *Attorney, Agent, or Firm* — McDonnell Boehnen Hulbert & Berghoff LLP

(57) ABSTRACT

The present invention relates generally to roofing products. The present invention relates more particularly to roofing products for use with photovoltaic elements, and to photovoltaic systems that include one or more photovoltaic elements joined to a roofing substrate. In one embodiment, a roofing product includes a flexible roofing substrate having a top surface, the top surface having one or more granule-coated zones thereon capable of acting as a receptor zone or an exposure zone, each zone being adapted to receive one or more photovoltaic elements; and an adhesive suitable for securing photovoltaic elements to one or more of the granule-coated zones, the adhesive capable of forming a bond to the granules and the top surface of the flexible roofing substrate and to the bottom surface of the photovoltaic elements.

13 Claims, 14 Drawing Sheets

(56) References Cited

U.S. PATENT DOCUMENTS

| | | |
|---|---|---|
| 2003/0217768 A1* | 11/2003 | Guha .............................. 136/244 |
| 2004/0055241 A1* | 3/2004 | Railkar ........................... 52/555 |
| 2004/0144043 A1 | 7/2004 | Stevenson et al. |
| 2004/0148874 A1* | 8/2004 | Jolitz et al. ....................... 52/105 |
| 2005/0178428 A1 | 8/2005 | Laaly et al. |
| 2005/0178429 A1 | 8/2005 | McCaskill et al. |
| 2005/0252137 A1* | 11/2005 | Bartek et al. .................... 52/518 |
| 2006/0032527 A1* | 2/2006 | Stevens et al. ................ 136/251 |
| 2007/0251571 A1 | 11/2007 | Jacobs et al. |
| 2008/0105291 A1* | 5/2008 | Pisklak et al. ................. 136/244 |
| 2008/0115444 A1* | 5/2008 | Kalkanoglu et al. ............ 52/518 |
| 2008/0302031 A1* | 12/2008 | Bressler et al. .............. 52/173.3 |
| 2009/0159118 A1 | 6/2009 | Kalkanoglu et al. |
| 2009/0223550 A1* | 9/2009 | Curtin et al. .................. 136/244 |
| 2011/0017278 A1* | 1/2011 | Kalkanoglu et al. .......... 136/251 |

FOREIGN PATENT DOCUMENTS

| | | |
|---|---|---|
| WO | 2008073905 A2 | 6/2008 |
| WO | 2009/061956 | 5/2009 |
| WO | 2009/062106 | 5/2009 |
| WO | 2009095762 A1 | 8/2009 |

\* cited by examiner

ROOFING PRODUCTS, PHOTOVOLTAIC ROOFING ELEMENTS AND SYSTEMS USING THEM

CROSS-REFERENCE TO RELATED APPLICATIONS

The present application claims priority under 35 U.S.C. §119(e) to U.S. Provisional Patent Application Ser. No. 61/232,739, which is hereby incorporated herein by reference in its entirety.

BACKGROUND OF THE INVENTION

1. Field of the Invention

The present invention relates generally to roofing products. The present invention relates more particularly to roofing products for use with photovoltaic elements, and to photovoltaic systems that include one or more photovoltaic elements joined to a roofing substrate.

2. Technical Background

The search for alternative sources of energy has been motivated by at least two factors. First, fossil fuels have become increasingly expensive due to increasing scarcity and unrest in areas rich in petroleum deposits. Second, there exists overwhelming concern about the effects of the combustion of fossil fuels on the environment due to factors such as air pollution (from $NO_x$, hydrocarbons and ozone) and global warming (from $CO_2$). Moreover, the very discovery and exploitation of fossil fuels carries significant environmental risk. In recent years, research and development attention has focused on harvesting energy from natural environmental sources such as wind, flowing water, and the sun. Of the three, the sun appears to be the most widely useful energy source across the continental United States; most locales get enough sunshine to make solar energy feasible.

Accordingly, there are now available components that convert light energy into electrical energy. Such "photovoltaic cells" are often made from semiconductor-type materials such as doped silicon in either single crystalline, polycrystalline, or amorphous form. The use of photovoltaic cells on roofs is becoming increasingly common, especially as device performance has improved. They can be used to provide at least a significant fraction of the electrical energy needed for a building's overall function; or they can be used to power one or more particular devices, such as exterior lighting systems.

Photovoltaic cells can be packaged as photovoltaic elements, in which one or more photovoltaic cells are electrically interconnected and provided in a common package. One common type of photovoltaic element is an encapsulated photovoltaic element, in which the photovoltaic cells are packaged together in between layers of layer material. The layer materials are often chosen to be highly light-transmissive, and to retain their transmissivity over time. Encapsulated photovoltaic elements can be convenient for integration with various substrates.

Roofing products in which a photovoltaic element is integrated with a roofing substrate (such as a shingle or tile) have been proposed. Such "photovoltaic roofing elements" (also known as "roofing-integrated photovoltaics" or "RIPV") can provide both protection from weather and power generation capability in a single product. Moreover, photovoltaic roofing elements can provide aesthetic benefit, as they can be made to blend with the architecture of the overall roof much better than can conventional photovoltaic modules.

Encapsulated photovoltaic elements can be convenient for integration with various substrates. However, in many circumstances, formation of a long-lived physical connection between the material of the encapsulated photovoltaic element and the material of a substrate can be difficult, especially when the materials used to make the encapsulated photovoltaic element have low surface tension. Notably, the surfaces used as the top layer of many roofing substrates, such as the coated granules typically used with bituminous roofing products, can be less than optimal for adhesion to a photovoltaic element.

There remains a need for roofing products and photovoltaic roofing systems that can address these deficiencies.

SUMMARY OF THE INVENTION

One aspect of the present invention is a roofing product for use with one or more photovoltaic elements, the roofing product including:
- a flexible roofing substrate having a top surface, the top surface having one or more granule-coated zones thereon capable of acting as a receptor zone or an exposure zone, each zone being adapted to receive one or more photovoltaic elements; and
- an adhesive suitable for securing photovoltaic elements to one or more of the granule-coated zones, the adhesive capable of forming a bond to the granules and the top surface of the flexible roofing substrate and to the bottom surface of the photovoltaic elements.

A photovoltaic roofing element including:
- the roofing product as described herein, with the adhesive disposed in the granule-coated zones; and
- one or more photovoltaic elements disposed on the adhesive in the one or more granule-coated zones of the top surface of the flexible roofing substrate.

In certain embodiments, at least some of the granule-coated zones remain exposed as exposure zones.

Another aspect of the present invention is a photovoltaic roofing element including:
- a flexible roofing substrate having a top surface, the top surface having one or more granule-coated zones thereon capable of acting as a receptor zone or an exposure zone;
- an adhesive covering and filling at least a portion of the granule-coated zones; and
- one or more photovoltaic elements disposed on the adhesive in the one or more granule-coated zones of the top surface of the flexible roofing substrate,
- at least some of the granule-coated zones remaining exposed as exposure zones.

Another aspect of the present invention is a photovoltaic roofing system including one or more photovoltaic roofing elements as described above, disposed on a roof deck.

Another aspect of the present invention is a photovoltaic roofing system kit including:
- a flexible roofing substrate having a top surface, the top surface having one or more granule-coated zones thereon capable of acting as a receptor zone or an exposure zone, each zone being adapted to receive one or more photovoltaic elements;
- an adhesive suitable for securing photovoltaic elements to one or more of the granule-coated zones, the adhesive capable of forming a bond to the granules and the top surface of the flexible roofing substrate and to the bottom surface of the photovoltaic elements; and
- one or more photovoltaic elements suitable for disposition on the adhesive when the adhesive is disposed in one or more of the granule-coated zones on the top surface of the flexible roofing substrate.

Another aspect of the present invention is a method for installing a photovoltaic roofing system on a roof deck, the roof deck having disposed thereon at least one flexible roofing substrate having a top surface, the top surface having one or more granule-coated zones thereon capable of acting as a receptor zone or an exposure zone, each zone being adapted to receive one or more photovoltaic elements, the method including:

disposing on a portion of the granule-coated zones an adhesive suitable for securing photovoltaic elements to one or more of the granule-coated zones, the adhesive capable of forming a bond to the granules and the top surface of the flexible roofing substrate; then disposing one or more photovoltaic elements on the one or more granule-coated zones of the top surface of the flexible roofing substrate on which are disposed the adhesive.

Another aspect of the present invention is a method for installing a photovoltaic roofing system as described above, the method including:

installing on a roof deck a flexible roofing substrate having a top surface, the top surface having one or more granule-coated zones thereon capable of acting as a receptor zone or an exposure zone, each zone being adapted to receive one or more photovoltaic elements; then disposing on a portion of the granule-coated zones an adhesive suitable for securing photovoltaic elements to one or more of the granule-coated zones, the adhesive capable of forming a bond to the granules and the top surface of the flexible roofing substrate; then disposing one or more photovoltaic elements on the one or more granule-coated zones of the top surface of the flexible roofing substrate on which are disposed the adhesive.

Another aspect of the present invention is a method for installing a photovoltaic roofing system as described above, the method including:

disposing on a portion of the granule-coated zones of a flexible roofing substrate having a top surface, the top surface having one or more granule-coated zones thereon capable of acting as a receptor zone or an exposure zone, each zone being adapted to receive one or more photovoltaic elements an adhesive suitable for securing photovoltaic elements to one or more of the granule-coated zones, the adhesive capable of forming a bond to the granules and the top surface of the flexible roofing substrate; then installing on a roof deck the flexible roofing substrate having the adhesive disposed thereon; then disposing one or more photovoltaic elements on the one or more granule-coated zones of the top surface of the flexible roofing substrate on which are disposed the adhesive.

Another aspect of the present invention is a method for installing a photovoltaic roofing system as described above, the method including:

installing on the roof deck a flexible roofing substrate having a top surface, the top surface having one or more granule-coated zones thereon capable of acting as a receptor zone or an exposure zone, each zone being adapted to receive one or more photovoltaic elements an adhesive suitable for securing photovoltaic elements to one or more of the granule-coated zones;

providing a photovoltaic element having an adhesive on its bottom surface; and disposing the adhesive on at least a portion of the granule-coated zones, thereby adhering the photovoltaic element to the flexible roofing substrate.

The products, elements, systems, methods and kits of the present invention can result in a number of advantages. For example, in some embodiments, the products and systems of the present invention can provide enhanced adhesion between a photovoltaic element and the flexible roofing substrate. In other examples, the methods of the present invention can be used to install a photovoltaic roofing system so that the installation of the relatively rugged flexible roofing substrate can be performed by a roofing professional, and the more fragile photovoltaic elements can be installed much later, by a person skilled in electrical interconnections. Other advantages will be apparent to the person of skill in the art.

The accompanying drawings are not necessarily to scale, and sizes of various elements can be distorted for clarity.

DETAILED DESCRIPTION OF THE INVENTION

Figure 1:
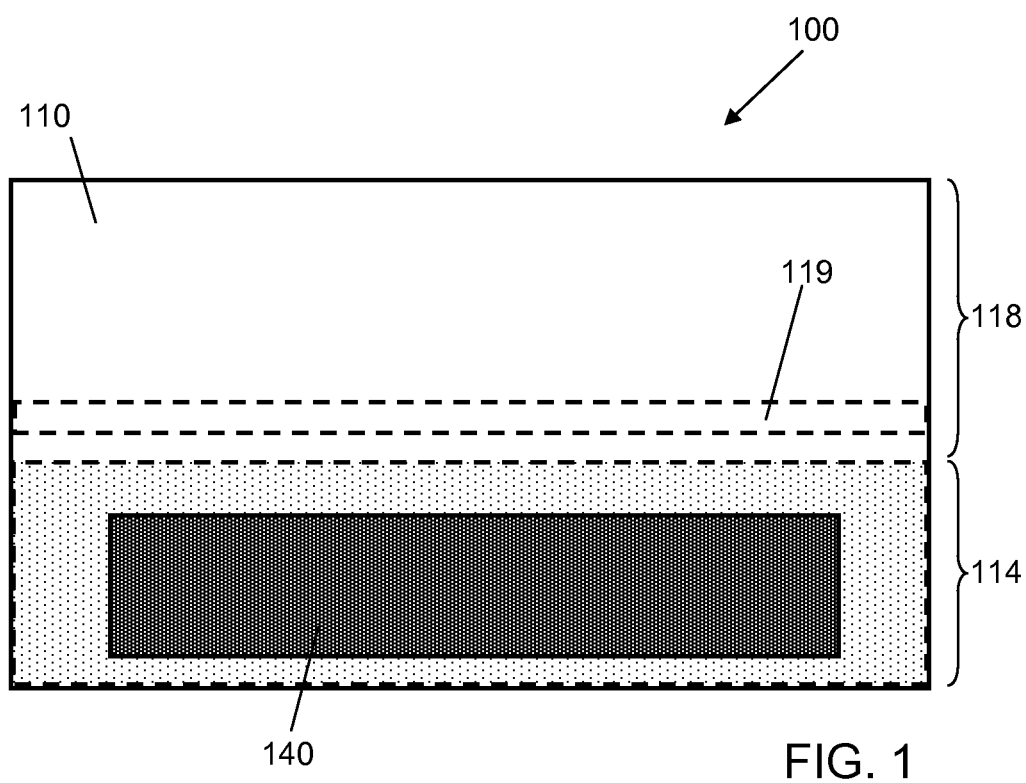
FIG. 1 is a schematic top view of a roofing product according to one embodiment of the invention.

The present invention provides a variety of products, elements, systems, methods and kits for use in outfitting a roof with a photovoltaic system. According to one aspect of the invention, a flexible roofing substrate with a granule covering is provided. A photovoltaic element can be adhered to the granule-coated area of the roofing substrate using an adhesive. For example, in certain embodiments, a locally flowable reactive adhesive is applied on the granule-coated area of the flexible roofing substrate after it is installed on the roof. The adhesive flows over the granules and into the crevices therebetween, thereby forming good contact and strong bonding to the flexible roofing substrate. A photovoltaic element is disposed on the adhesive (i.e., so that its bottom surface contacts the adhesive), and the adhesive can set or cure to lastingly adhere the photovoltaic element to the flexible roofing substrate. Notably, the adhesive can be applied in any desired geometry, such that any size or shape of photovoltaic element can be adhered to the roofing substrate. A single photovoltaic element can be installed across multiple roofing substrates, and multiple photovoltaic elements can be installed on a single roofing substrate, depending on the relative sizes and shapes thereof. The adhesive can be selected such that it is flowable enough to penetrate in between the granules, yet have a shear resistance such that on a sloped roof, it remains in place without slumping due to gravity before the photovoltaic element is disposed thereon. A variety of additional and alternative aspects and embodiments of the invention are described herein, for example, using different adhesive systems, roofing substrates, photovoltaic elements and installation methods.

One aspect of the invention is a roofing product for use with one or more photovoltaic elements. One embodiment of such a roofing product according to the present invention is shown in schematic top view in FIG. 1. Roofing product 100 comprises a flexible roofing substrate 110 having a top surface, which has one or more granule-coated zones 114 thereon (in this case, one). The granule-coated zones are coated with roofing granules. Notably, as described in more detail herein, a granule-coated zone is capable of acting as a receptor zone (i.e., for the application and adhesion of one or more photovoltaic elements) or an exposure zone (i.e., to remain exposed and visible after one or more photovoltaic elements are applied to the flexible roofing substrate, and/or after one or more overlying flexible roofing substrates are applied). In use, the person of skill in the art can adhere one or more photovoltaic elements to the granule-coated zones. Any areas of the granule-coated zones not covered by photovoltaic elements (i.e., exposed areas), however, can have a desirable appearance as a result of the granule covering the surface of the roofing substrate. Moreover, the granules can protect the underlying materials of the roofing substrate from UV-induced damage.

The sizes and shapes of the one or more granule-coated zones can, for example, be selected based on the sizes and shapes of the photovoltaic elements envisioned for use therewith. For example, certain photovoltaic elements available from United Solar Ovonic have dimensions of about 12 cm×18 cm (T-Cells); about 24 cm×36 cm (L-Cells); or about 40 cm×5 m (strip). Of course, in certain embodiments, the granule-coated zones are larger in at least one dimension than the photovoltaic elements. In such embodiments, when the photovoltaic elements are installed, any exposed area is covered with granules, and therefore can have a desirable appearance and durability. In some embodiments, the granule-coated zone has a dimension that is only somewhat larger than (e.g., in the range of 101-120% of, or even 101-110% of) the corresponding dimension of the photovoltaic elements with which they are to be used. Such embodiments can be more user-friendly, as precise alignment is not necessary for an installer to accurately place the photovoltaic element completely within the granule-coated zone. In certain embodiments, when an elongated photovoltaic element is used, such as the strips available from United Solar Ovonic, minor angular misalignments can be tolerated.

The flexible roofing substrate can be, for example, a bituminous substrate. For example, in certain embodiments it can be a bituminous roofing membrane. In other embodiments, the flexible roofing substrate is an asphalt shingle.

For example, in the embodiment of FIG. 1 the flexible roofing substrate 100 is a conventionally-shaped and -sized laminated asphalt shingle. The shingle has a granule-coated zone 114 and a headlap zone 118; in this embodiment, the granule-coated zone 114 covers the entire area of the shingle that is not to be covered by overlying courses of shingles when installed. In the headlap zone is a fastening zone 119, as is conventional in roofing shingles. In certain embodiments (e.g., as described below with respect to FIG. 5), the shingle has a plurality of tabs formed in the area of the shingle that is not to be covered by overlying courses of shingles when installed, as is conventional in the roofing arts.

The roofing product further includes an adhesive suitable for securing the photovoltaic elements to one or more of the granule-coated zones. The adhesive is capable of forming a bond to the granules and the top surface of the flexible roofing substrate and to the bottom surface of the photovoltaic elements. In certain embodiments, the adhesive is provided disposed on the roofing substrate in the granule-coated zone before it is installed on the roof, for example, as described below, and as shown in FIG. 1 at reference number 140. In use, the roofing product can be installed on the roof, then the adhesive used to adhere a photovoltaic element thereto. In other embodiments, the adhesive is provided separately, together with the roofing substrate in the form of a kit. In such embodiments, the roofing substrate can be installed on the roof, then the adhesive applied, for example, as described below. Moreover, in certain embodiments, the adhesive is provided as part of a photovoltaic element having the adhesive on its bottom surface (e.g., with a releasable liner in a "peel-and-stick" fashion).

Figure 2:
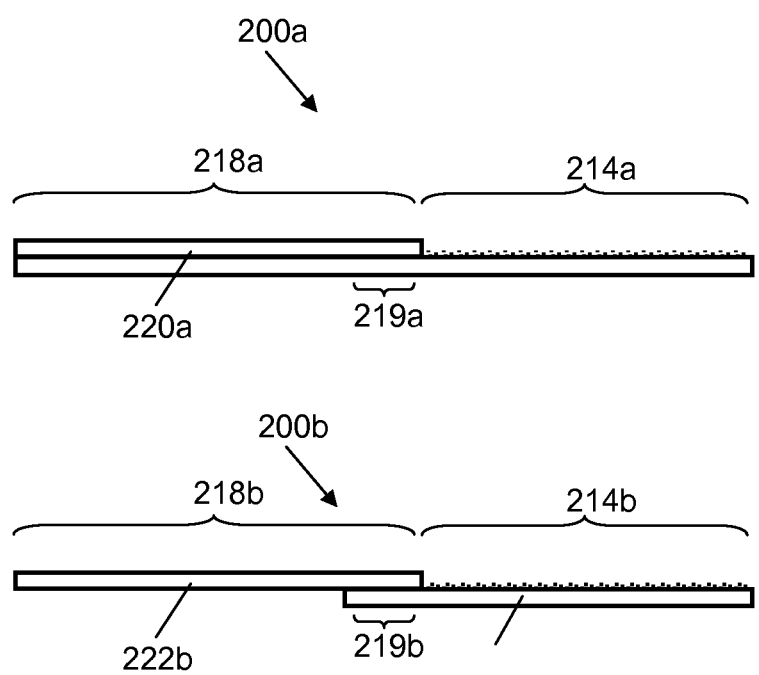
FIG. 2 is a schematic cross-sectional view of two embodiments of flexible roofing substrates.

In certain embodiments, the top surface of the flexible roofing substrate in the granule-coated zone is recessed from the top surface of the flexible roofing substrate in the area adjacent to the granule-coated zone. For example, the shingle 200a shown in schematic side cross-sectional view in FIG. 2, has a granule-coated zone 214a and a headlap zone 218a. The shingle 200a includes a shim 220a on its top surface in the headlap zone. Fastening zone 219a extends along the headlap zone near its down-roof end. In another embodiment, the shingle is formed from overlapping materials, as shown in FIG. 2 with reference to shingle 200b. Shingle 200b has a granule-coated zone 214b and a headlap zone 218b. The shingle 200b is formed from two overlapping sheets 220b and 222b of asphalt roofing material. The fastening zone 219b extends along the overlap area. Use of overlapping sheets in constructing a shingle can, for example, allow the flexible roofing element to lay flat on a roof deck.

Figure 3:
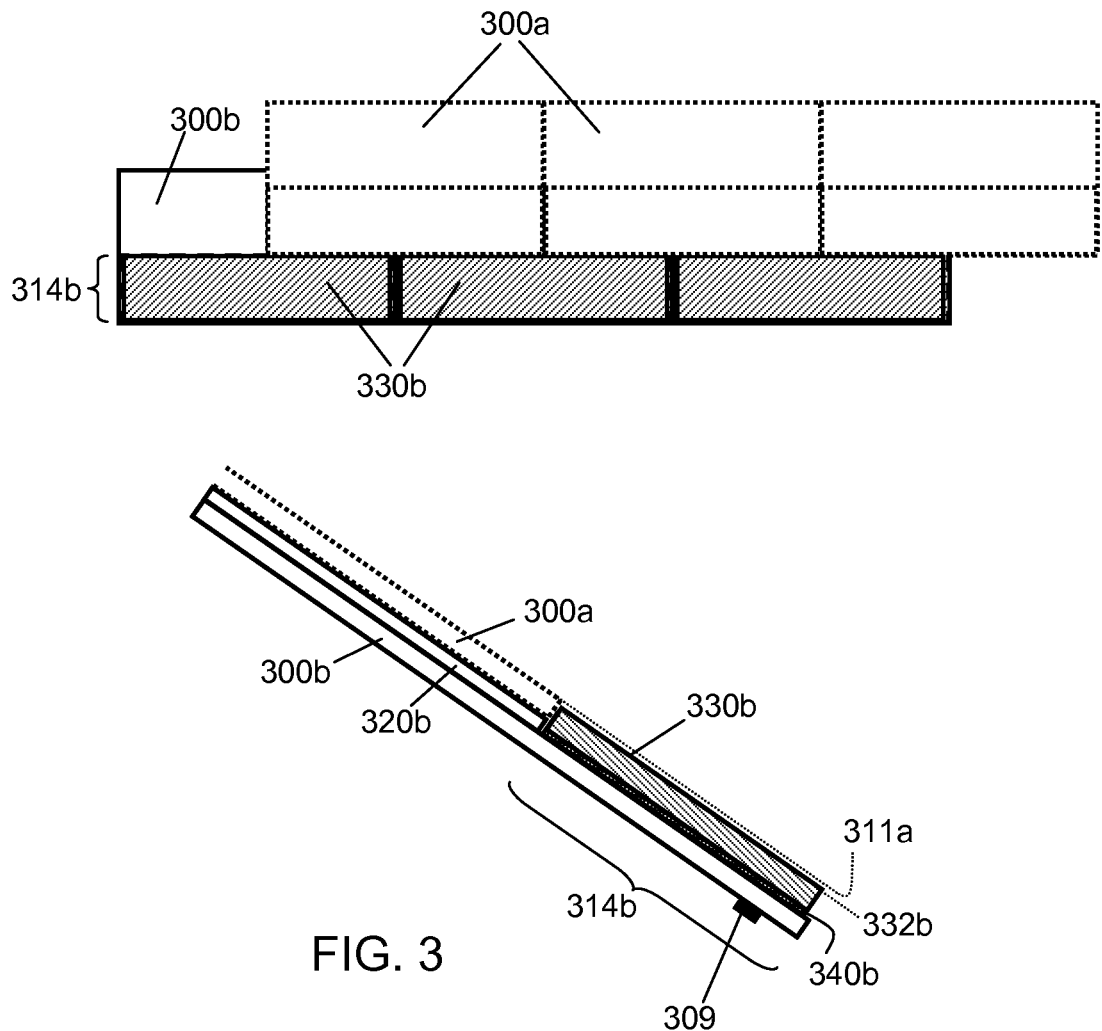
FIG. 3 is a schematic top view and a schematic cross-sectional view of roofing products with photovoltaic elements adhered thereto, according to one embodiment of the invention.

In certain embodiments, the shim provides sufficient thickness so that if a photovoltaic element is installed in the granule-coated zone, the top surface plane of the photovoltaic element will be at or below the level of the top surface plane of an overlying course of shingles (as measured along the surface normal to the roof deck). Such an arrangement can help aid in effective drainage and runoff of water from the roof. For example, FIG. 3 is a schematic top view and schematic side cross-sectional view of two courses of roofing products as described herein, with photovoltaic elements adhered thereto. Shingles 300a (shown in dotted line, and only partially in the side view) are disposed on a roof deck (not shown) so that they overlie shingles 300b. Shingles 300a have disposed in their granule-coated zones 314b photovoltaic elements 330b, adhered thereto with the adhesive 340b. The shims 320b are of sufficient thickness so that the top surface plane 311a of the shingles 300a is at or above the top surface plane 332b of the photovoltaic elements 330b. As the person of skill in the art will appreciate, a shim can alternatively or additionally be provided on the bottom face of the shingle in its headlap zone to add thickness to the headlap zone. The person of skill in the art will take into account the relative sizes of the headlap zone and the portion of the roofing substrate to remain uncovered by overlying elements in determining the size of the shim.

The embodiment of FIG. 3 also includes a sealant 309 on the bottom surface of the flexible roofing substrate, e.g., in a generally linear stripe. The sealant stripe can perform a number of sealing functions. For example, in one embodiment, the sealant stripe is positioned across the bottom surface of the flexible roofing substrate such that when it is applied over another course of flexible roofing substrates in an array, the sealant aligns with the lower edge of the shim on the top surface of the headlap zone of the underlying flexible roofing substrate. In another embodiment, the sealant is provided near the down-roof end of the flexible roofing element, so that the sealant would align with the upper end of the photovoltaic element disposed on an underlying flexible roofing substrate. In another embodiment, the sealant line is provided on the top surface of the flexible roofing substrate, for example, near the down-roof end of the shim, so that an overlying flexible roofing element seals against it. The person of skill in the art will understand that the sealant stripe may be continuous or discontinuous, and may be formed in a variety of patterns on a surface of the shingle. The use of sealants is described further in U.S. patent application Ser. No. 12/560,724, which is hereby incorporated herein by reference in its entirety.

Figure 4:
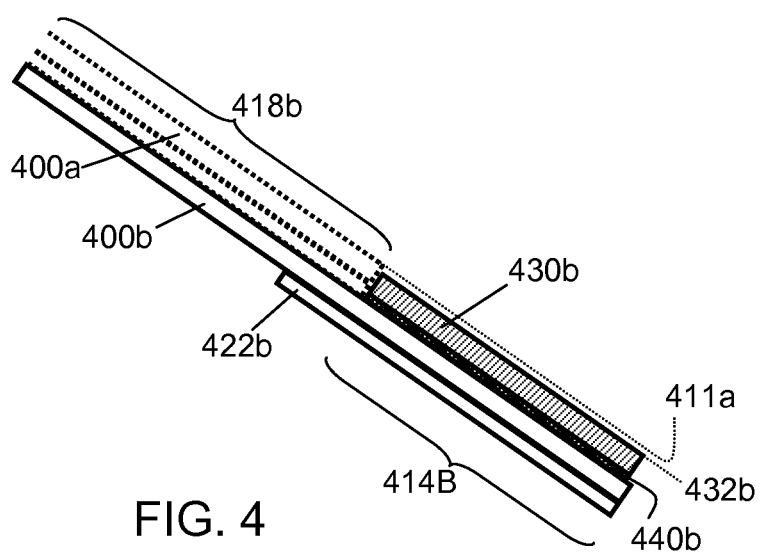
FIG. 4 is a schematic cross-sectional view of roofing products with photovoltaic elements adhered thereto, according to one embodiment of the invention.

In another embodiment, the shingle has a shim disposed on its bottom surface under the granule-coated zone. For example, FIG. 4 is a schematic side cross-sectional view of two courses of roofing products as described herein. Shingles 400a (shown in dotted line) are disposed so that they overlie shingles 400b, as described above with respect to FIG. 3. Shingles 400b have disposed in their granule-coated zones 414b photovoltaic elements 430b, adhered thereto with the adhesive 440b. The shims 422b are disposed on the undersides of the shingles, underneath the granule-coated zones 414b and extending into the headlap zones 418b, and are of sufficient thickness so that the top surface plane 411a of the shingles 400a is at or above the top surface plane 432b of the photovoltaic elements 430b. The person of skill in the art will take into account the relative sizes of the headlap zone and the portion of the roofing substrate to remain uncovered by overlying elements in determining the size of the shim.

In certain embodiments, a shim is provided both in the headlap zone, as described above with reference to FIGS. 2 and 3, and underneath the granule-coated zone, as described above with reference to FIG. 4. This can provide even more thickness buildup for providing space for the photovoltaic element while allowing proper drainage. The use of multiple shims can also provide design flexibility; for example, where the shingle does not receive a photovoltaic element, the shims can be used to allow for slots or cutouts to provide a desired visual effect. The person of skill in the art will take into account the relative sizes of the headlap zone and the portion of the roofing substrate to remain uncovered by overlying elements in determining the sizes of the shims.

Roofing granules are familiar to the person of skill in the art. They can be, for example, ceramic-coated mineral particles, as are conventionally used in roofing applications. In certain embodiments, the roofing granules are of an average size of about 1-2 mm (e.g., about #11 mesh). The roofing granules can be, for example, the same type, color and distribution as those used in any other exposed roof area (e.g., an inactive area of the shingle, as described below), so that any exposed granule-coated zones match the appearance of the rest of the roof.

Of course, a variety of types of roofing granules may be used in practicing various aspects of the present invention. Roofing granules may be made from virtually any material that will withstand exposure to the environment without substantially degrading over a period of years, e.g., rock, mineral, gravel, sand, ceramic, or plastic. In certain embodiments of the invention, the granules are ceramic-coated mineral core particles optionally colored with metal oxides, such as those conventionally used on asphalt roofing shingles. The mineral core can consist of any chemically inert matter that can support a ceramic layer and has adequate mechanical properties. The mineral particles, which can be produced by a series of quarrying, crushing, and screening operations, are generally intermediate between sand and gravel in size (that is, between about 8 US mesh and 70 US mesh). In certain embodiments, roofing granules for use in the present invention have an average particle size of from about 0.2 mm to about 3 mm, and more preferably from about 0.4 mm to about 2.4 mm. In particular, suitably sized particles of naturally occurring materials such as talc, slag, granite, silica sand, greenstone, andesite, porphyry, marble, syenite, rhyolite, diabase, greystone, quartz, slate, trap rock, basalt, and marine shells can be used, as well as recycled manufactured materials such as crushed bricks, concrete, porcelain, ceramic grog, ground recycled tires and fire clay.

Other materials, such as natural mineral matter (e.g., sand, crushed rock, and the materials listed above as suitable for the cores of coated granules), polymeric granules, and other synthetic materials can also be used. Polymeric materials, for example, can be provided with a variety of shapes (e.g., spherical, angular, sub-angular), which can contribute, in whole or in part, to the desired appearance.

In certain embodiments, the granules can be relatively plate-like in shape (e.g., having one dimension that is at least half of the other two dimensions) to provide for more uniform surface coverage. Such granules can be formed, for example, from slate. In certain embodiments, such granules can provide the desired distance between the tops of the granules and the substrate surface, without having to be deeply embedded into the substrate material.

In certain embodiments, the granules are disposed on the roofing substrate in granule-coated zone (and/or in any inactive zones) with a surface fill factor of greater than about 60%. The surface fill factor is the fraction of the zone that is occluded by the granules, as measured in a direction normal to surface. Desirably, the granules have a surface fill factor of greater than about 75%. In certain desirable embodiments of the invention, the granules have a surface fill factor of greater than about 85%. Granule surface coverage can be measured using image analysis software, namely, Image-Pro Plus from Media Cybernetics, Inc., Silver Spring, Md. The shingle surface area is recorded in a black and white image using a CCD camera fitted to a microscope. The image is then separated into a bituminous coating portion and a granule covering portion using the threshold method in gray scale. The amount of granule coverage is then calculated by the image analysis software based upon the number of pixels with gray scale above the threshold level divided by the total number of pixels in the image. As the person of skill will recognize, in certain embodiments relatively high surface fill factors can be used across the entire roofing product, or in other embodiments, substantially only in the exposure area of the roofing product.

More than one type of granule can be used in the granule-coated zone. For example, a combination of larger (e.g., #11 mesh) and smaller (e.g., #18 or #22 mesh) granules can be used.

The roofing granules can, for example, be solar reflective granules. Solar-reflective granules can be used, for example, in areas of the roofing product that are to remain exposed to the atmosphere when a structure or device is adhered. The solar-reflective roofing granules can, for example, be coated over the entire exposed area of the roofing product, or alternatively only in the exposed area that is not to be covered with devices or structures, with the areas to be covered coated with less reflective roofing granules. The solar-reflective roofing granules can operate to reflect a portion of the solar radiation (e.g., in the infrared wavelengths) and thereby decrease the buildup of heat on the roof. The effective working temperatures of the roof can thereby be lowered, which can be advantageous in maintaining structures on the roof at a desirably low temperature. The solar-reflective roofing granules can be disposed on the bituminous roofing substrate in an amount sufficient to provide the zone so coated with a solar reflectivity greater than about 0.25. In one embodiment of the invention, the solar-reflective roofing granules have a solar reflectivity greater than about 0.3, or even greater than about 0.4. Solar reflectance can reduce the effective temperature of the roof surface, which can improve the efficiency of power generation of the photovoltaic elements disposed thereon, as described in U.S. Patent Application Publication no. 2009/0133738, which is hereby incorporated herein by reference in its entirety. In some embodiments, the top surface of the bituminous roofing substrate is not coated with solar-reflective granules in the one or more over-pressed zones (e.g., those that are to be covered by an element or structure), resulting in more economical use of solar reflective coating or solar reflective roofing granules. Similarly, in some embodiments, the solar reflective granules do not extend to areas of the roofing product which are not visible when installed (e.g., the headlap region of a shingle, or the selvage region of a roofing membrane).

In certain embodiments, the granule-coated zone covers the entire area of the roofing substrate that is not to be covered by overlying roofing substrates when installed, as described above with respect to FIG. 1. In other embodiments, the granule-coated zone does not cover the entire area of the roofing substrate that is not to be covered by overlying roofing substrates when installed. In such embodiments, an inactive zone is adjacent the granule-coated zone. The inactive zone can be covered with granules as well, but is different in some property than the granule-coated zone. For example, the granules themselves can be different, the way the granules are embedded in the roofing substrate can be different, and/or there can be a difference in coatings or other materials between the two zones. For example, as shown in top view in FIG. 5, flexible roofing substrate 500 is an asphalt shingle 510 having three tabs 506 extending from headlap zone 518. Each tab has a granule coated zone 514 thereon, but each granule-coated zone does not cover the entire tab. Rather, each tab includes an inactive zone 515 surrounding the granule-coated zone 514. The inactive zone has some property different from the granule-coated zone. For example, in certain embodiments, the inactive zones are coated with solar-reflective granules, whereas the granule-coated zones are coated with conventional roofing granules. In other embodiments, the granules in the granule-coated zone are embedded in the material of the roofing substrate more deeply than are the granules in the in the inactive zone.

In some embodiments of the invention, the surfacing of the one or more granule-coated zones is selected so that the appearance of the granule-coated zone is complementary to the top surface of the flexible roofing substrate in the area adjacent to the granule-coated zone (e.g., in an inactive area), and/or to the top surface of another roofing element on the roof (e.g., a conventional roofing shingle, and/or roofing materials disposed at the ridge of the roof). As used herein $L^*$, $a^*$ and $b^*$ are the color measurements for a given sample using the 1976 CIE color space. The strength in color space $E^*$ is defined as $E^*=(L^{*2}+a^{*2}+b^{*2})^{1/2}$. The total color difference $\Delta E^*$ between two articles is defined as $\Delta E^*=(\Delta L^{*2}+\Delta a^{*2}+\Delta b^{*2})^{1/2}$, in which $\Delta L^*$, $\Delta a^*$ and $\Delta b^*$ are respectively the differences in $L^*$, $a^*$ and $b^*$ for the two articles. $L^*$, $a^*$ and $b^*$ values are measured using a HunterLab Model Labscan XE spectrophotometer using a 0° viewing angle, a 45° illumination angle, a 10° standard observer, and a D-65 illuminant. Lower $L^*$ values correspond to relatively darker tones. In such embodiments, if part or all of a granule-coated zone is not covered by a photovoltaic element, it can complement the rest of the exposed surface of the flexible roofing substrate and/or the top surface of another roofing element on the roof. In certain embodiments of the invention, the granule-coated zone has a $\Delta E^*<30$ compared to the top surface of the flexible roofing substrate in the area adjacent to the granule-coated zone and/or to the top surface of another roofing element on the roof. In some embodiments, the granule-coated zone has a $\Delta E^*<20$ compared to the top surface of the flexible roofing substrate in the area adjacent to the granule-coated zone and/or to the top surface of another roofing element on the roof. For example, the granule-coated zone can be coated with granules of similar color and distribution as those used in the area adjacent to the granule-coated zone and/or on the top surface of another roofing element on the roof.

Figure 6:
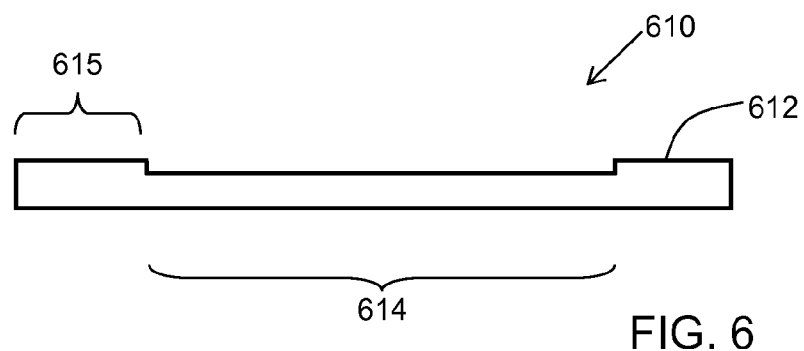
FIG. 6 is a partial schematic cross-sectional view of a flexible roofing substrate according to another embodiment of the invention.

As described above, in certain embodiments of the invention, the top surface of the flexible roofing substrate in the granule-coated zone is recessed from the top surface of the flexible roofing substrate in the area adjacent to the granule-coated zone (e.g., in an inactive zone). In one such embodiment, the top surface of the flexible roofing substrate in the granule-coated zone is recessed from the top surface of the flexible roofing substrate in an inactive zone. For example, as shown in partial schematic cross-sectional view in FIG. 6, flexible roofing substrate 610 has a top surface 612. The top surface of the flexible roofing substrate in the granule-coated zone 614 is recessed from the top surface of the flexible roofing substrate in the area 615 adjacent to the granule-coated zone 614. In certain such embodiments, when a photovoltaic element is disposed in the granule-coated zone, its top surface can be substantially flush with the top surface of the area adjacent to the granule-coated zone. The granule-coated zone can be recessed from the area adjacent thereto by, for example, at least about 1 mm, or even at least about 2 mm. In certain embodiments, the granule-coated zone is recessed from the area adjacent thereto by a distance in the range of about 65% to about 150% of the thickness of the photovoltaic element to be used with the roofing product.

In certain embodiments, the granules in the granule-coated zones can be embedded in the bituminous material in the granule-coated zones so as to have 0.20 gram loss or less in a rub test as described in ASTM D-4977. When there exists an inactive area, the granules in the inactive area can, in certain embodiments, be embedded in the bituminous material so as to have substantially greater than 0.20 gram loss or less in a rub test as described in ASTM D-4977, for example, 0.3 or greater, or even 0.4 or greater. The ASTM D-4977 standard is hereby incorporated herein by reference in its entirety.

In another embodiment, the granules in the granule-coated zones are embedded in the bituminous material so that the average granule embed volume fraction is at least 50%. That is, each granule is embedded such that a certain fraction of its volume is lower than the surface of the bituminous material; this fraction is its embed volume fraction. According to this embodiment of the invention, the average embed volume fraction for all granules in the granule-coated zones is at least 50%. For example, the average granule embed volume fraction in the granule-coated zones can be at least 60%, at least 70%, or even at least 85%. When there exists an inactive area, the average granule embed fraction in the inactive area can be, for example, substantially less than 50%. For example, the average granule embed fraction in the inactive zone can be less than 45%, less than 40%, or even less than 30%.

Figure 5:
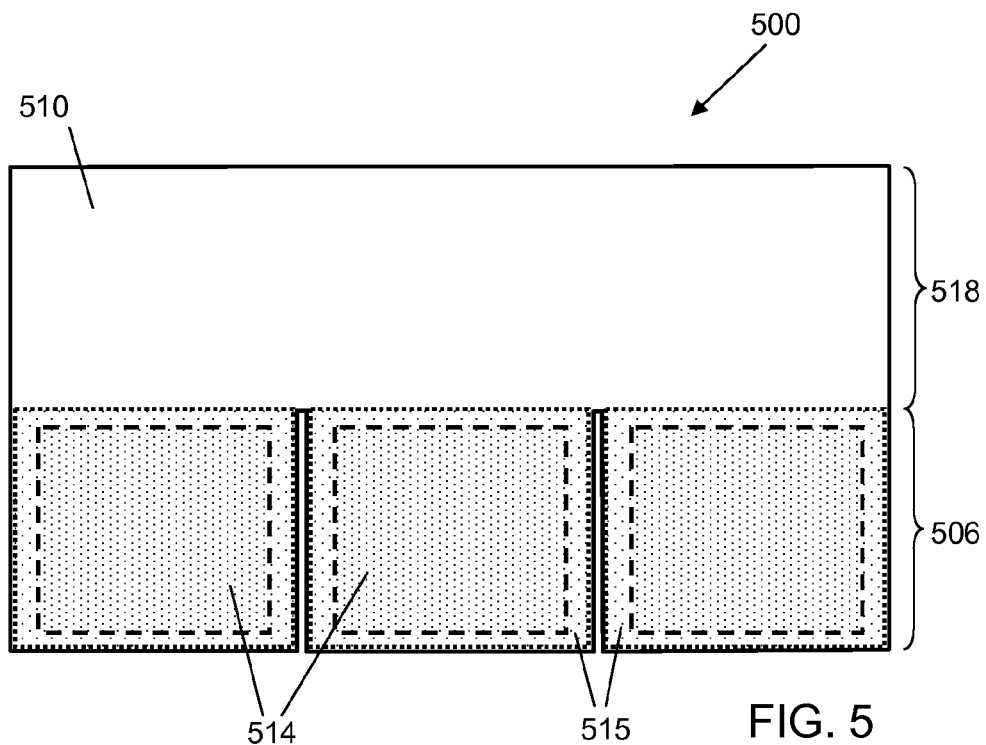
FIG. 5 is a schematic top view of a flexible roofing substrate according to one embodiment of the invention.
Figure 7:
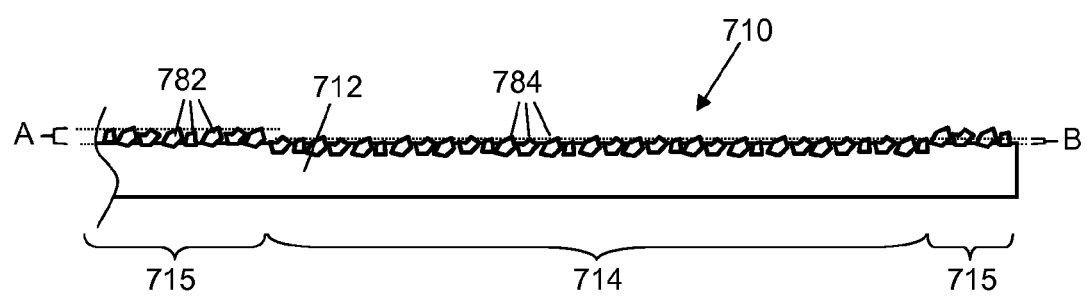
FIG. 7 is a schematic cross-sectional view of a flexible roofing substrate according to another embodiment of the invention.

In certain embodiments, the roofing granules in the granule-coated zone are pressed into the bituminous material more than are the roofing granules in the inactive areas of the roofing substrate. For example, as shown in schematic cross-sectional view in FIG. 7, a flexible roofing substrate 710 formed from a bituminous material 712 has a granule-coated zone 714 and an inactive zone 715. The inactive zone, for example, can frame the granule-coated zone (e.g., as shown in FIG. 5). As is conventional in bituminous roofing materials, roofing granules 782 are disposed on the surface of the bituminous material in the inactive zone. In the granule-coated zone, roofing granules 784 are also disposed on the surface of the bituminous material, but they are embedded substantially more deeply in the bituminous material than are the granules in the inactive area. For example, as shown in FIG. 7, the distance between the average top of the granules and the surface of the bituminous material can be substantially greater in the inactive area ("A") than in the granule-coated zone ("B"). The granules in the granule-coated zones can be pushed more deeply into the bituminous material in the granule coating process, for example, by first coating both the inactive areas and the granule-coated zones with granules as is conventional, then, while the bituminous material is still soft, pushing the granules down farther only in the granule-coated zones. The second pressing operation can also be performed with a separate heating of the substrate to soften the bituminous material. Alternatively, a granule press with the desired surface relief can be used in the initial coating process.

When the granules are embedded relatively deeply in the bituminous material, the bituminous material can more strongly interact with the material of the photovoltaic element and/or an adhesive, providing a stronger bond than when the photovoltaic element and/or adhesive substantially interacts only with the granules. This embodiment of the invention can be especially advantageous when used in conjunction with a pressure sensitive adhesive. Moreover, the reduced distance between the top of the granules and the top of the bituminous material can in many circumstances provide increased contact between an adhesive and the surface of the granule-coated zone (e.g., when the adhesive is not free-flowing). Bituminous roofing products with relatively deeply-embedded substrates are described in more detail in U.S. Provisional Patent Application Ser. No. 61/358,703, which is hereby incorporated by reference in its entirety.

Figure 8:
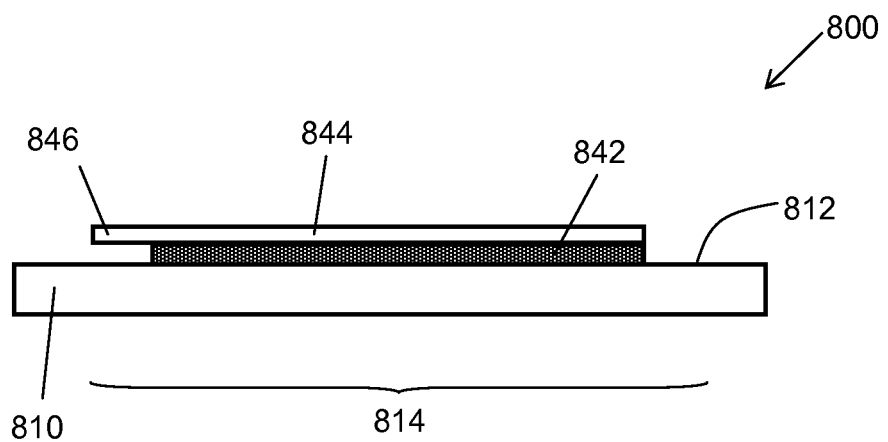
FIG. 8 is a schematic cross-sectional view of a roofing product according to one embodiment of the invention.

In certain embodiments, when the adhesive is provided on the granule-coated zone (or is applied on the granule-coated zone some time before the photovoltaic elements are applied), the adhesive is covered by a releasable liner. For example, as shown in partial schematic cross-sectional view in FIG. 8, roofing product 800 includes flexible roofing substrate 810, which has a top surface 812 having a granule-coated zone 814. Disposed on the top surface 812 in part of the granule-coated zone 814 is adhesive 842 covered by a releasable liner 844. In such embodiments, the releasable liner can be removed (e.g., by peeling using pull tab 846) to expose the adhesive material, which can be used to affix a photovoltaic element to the granule-coated zone. The releasable liner can be, for example, release-coated paper. The adhesive material can be, for example, a pressure sensitive adhesive such as a functionalized EVA-based pressure-sensitive adhesive (e.g., HP Fuller 9917). The adhesive can, for example, be disposed in the granule-coated zone of an already-installed roofing product in one operation, then a photovoltaic element adhered can be thereto in a subsequent operation. In other embodiments, the adhesive is provided on the roofing product before installation.

In some embodiments of the invention, the surfacing of the one or more granule-coated zones includes one or more alignment marks (e.g., printed or embossed) to aid in the alignment and installation of a photovoltaic element. For example, the alignment marks can correspond with the visible separations between sets of photovoltaic cells in the photovoltaic element. In other embodiments, the alignment marks can correspond with markings formed on the top surface and/or the bottom surface (e.g., the bottom surface of an adhesive layer) of the photovoltaic element. In other embodiments, the alignment marks can correspond to markings formed on a surface of a releasable liner (e.g., the surface in contact with an adhesive layer, or the bottom surface); as the releasable liner is removed to expose the adhesive layer (e.g., when the photovoltaic element is supplied in roll form), the installer can use it as a guide to ensure alignment of the photovoltaic element to the granule-coated zone. The use of alignment marks can be especially useful when using photovoltaic elements in strip form, as the potential for alignment is higher for long, thin strips (e.g., United Solar Ovonic strip photovoltaic element). The use of alignment marks in the granule-coated zone can be especially useful when the photovoltaic element is smaller than the granule-coated zone, so that the alignment marks are visible when the photovoltaic element is disposed thereon.

In other embodiments, the flexible roofing substrate includes one or more alignment marks (e.g., printed or embossed) in an area adjacent the granule-coated zone to aid in the alignment and installation of a photovoltaic element. The alignment marks can be as described above for the alignment marks in the granule-coated zone. For example, the alignment marks can correspond with the visible separations between sets of photovoltaic cells in the photovoltaic element. In other embodiments, the alignment marks can correspond with markings formed on the top surface of the photovoltaic element. When the flexible roofing substrate is a shingle, the alignment marks can be, for example, in the headlap area.

In one embodiment, the flexible roofing substrate is a roofing membrane, such as the type used in multiple layer or built-up roofing systems. In such embodiments, the flexible roofing substrate can be provided, for example, as elongated sheets, which can be transported to the worksite in roll form. The roofing membrane can be, for example, formed from a bituminous material, and can be reinforced with fibers, glass mat, felt, or fabric, and coated with roofing granules as described herein. In other embodiments, the roofing membrane can be formed from a rubber or polymeric material. Installation of the membrane can be performed through a variety of mechanical fasteners, adhesives, torching, or any other suitable methods. Adjacent sheets of roofing membrane can be sealed together where they adjoin. The roofing membranes of the present invention can be installed together with conventional roofing membrane products, to provide only certain areas of the roof with photovoltaic power generation capability. Roofing membranes can be formed, for example, from a single sheet of material with different surfacings formed thereon, or can be formed by combining sheets of material side-by-side so as to make a single membrane having different surfacings.

In another embodiment, the flexible roofing substrate is a shingle. For example, the shingle can be formed from a bituminous material, which can be reinforced with fibers, glass mat, felt, or fabric, and coated with roofing granules (e.g., in areas outside of the granule-coated zones). Shingles can, for example, be provided in product constructions that have a single layer of bituminous shingle material. In other embodiments, multilayer laminated shingle constructions can be used. Laminated shingles can provide for a wide range of aesthetic effects in shingle design, as well as provide space within the shingle to accommodate wiring and electrical connector structures. For example, as the person of skill in the art will appreciate, a backing shim can be used to provide an aesthetic effect delineating any tabs on the shingle, and/or create the illusion of shadows and structure, as well as providing another layer of material to cover a roof. The backing shim can underlay the entire shingle, or alternatively can underlay only part of the shingle. Laminated shingles can also yield a flatter laying product without undesirable bumps when installed. Examples of suitable shingle designs and constructions include those available from CertainTeed Corporation, including, for example, the Centennial Slate™ shingle and the Hatteras® shingle. Shingles can be manufactured, for example, using conventional methods, and cut into individual pieces. Shingles can be provided in bundles to a worksite, and can be installed using mechanical fasteners or other suitable methods. Adjacent courses of shingles can be applied in an overlapping manner to cover and protect the roof. The shingles of the present invention can be installed together with conventional shingles, to provide only certain areas of the roof with photovoltaic power generation capability.

Figure 9:
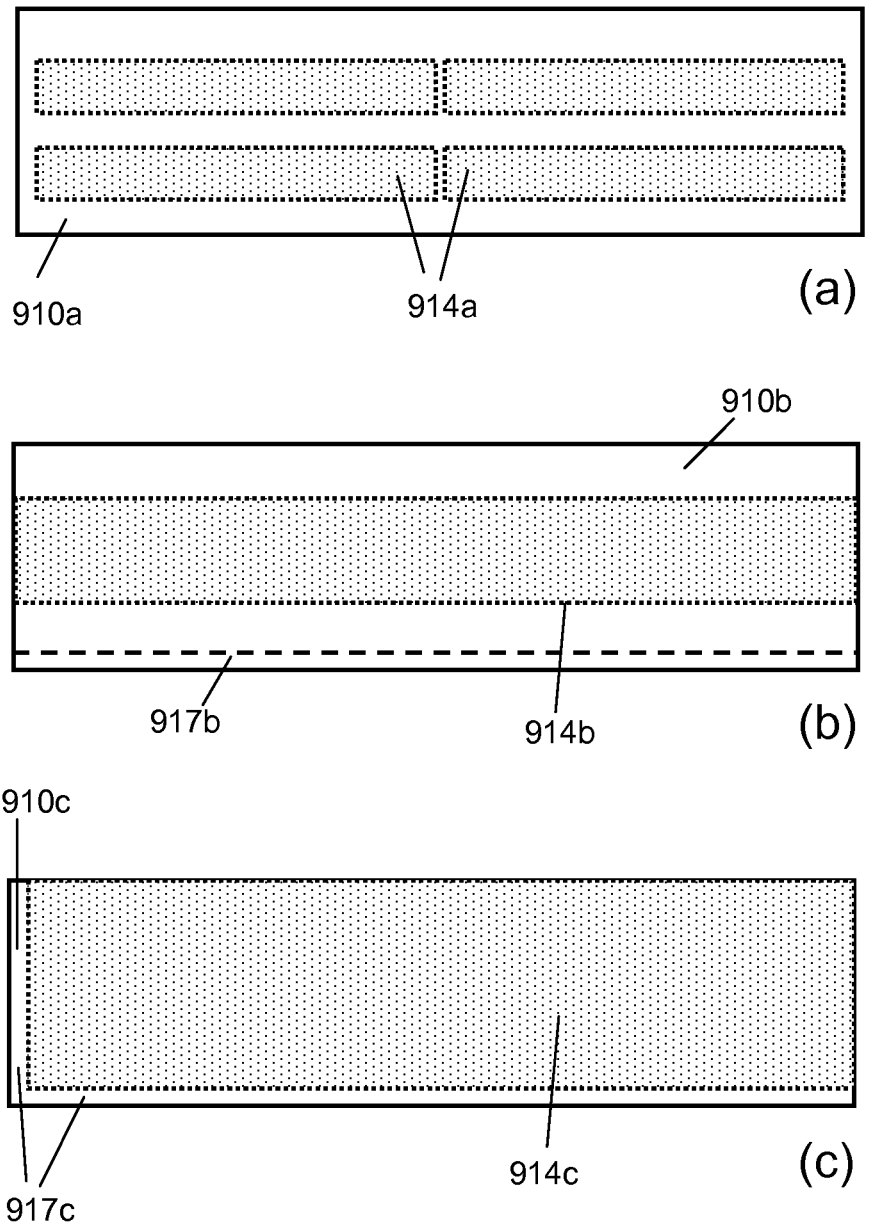
FIG. 9 is a set of top schematic views of flexible roofing substrates according to various embodiments of the invention.

The one or more granule-coated zones can be provided on the flexible roofing substrate in a wide variety of geometries. For example, they can be provided as islands or isolated zones (e.g., as described above with respect to FIG. 5); or alternatively can extend the length of a flexible roofing substrate (e.g., as described above with respect to FIG. 1). For example, in one embodiment, as shown in FIG. 9(a), the granule-coated zones 914a are formed as isolated zones on the top surface of a roofing membrane 910a. In another embodiment, as shown in FIG. 9(b), a granule-coated zone 914b is formed to continuously extend along the length of a roofing membrane 910b, as shown in FIG. 9(b). In other embodiments, the granule-coated zone 914c is formed to cover the entire surface of a roofing membrane 910c except for one or more selvage zones 917b and 917c formed along one or more edges, as shown in FIGS. 9(b) and 9(c).

Figure 10:
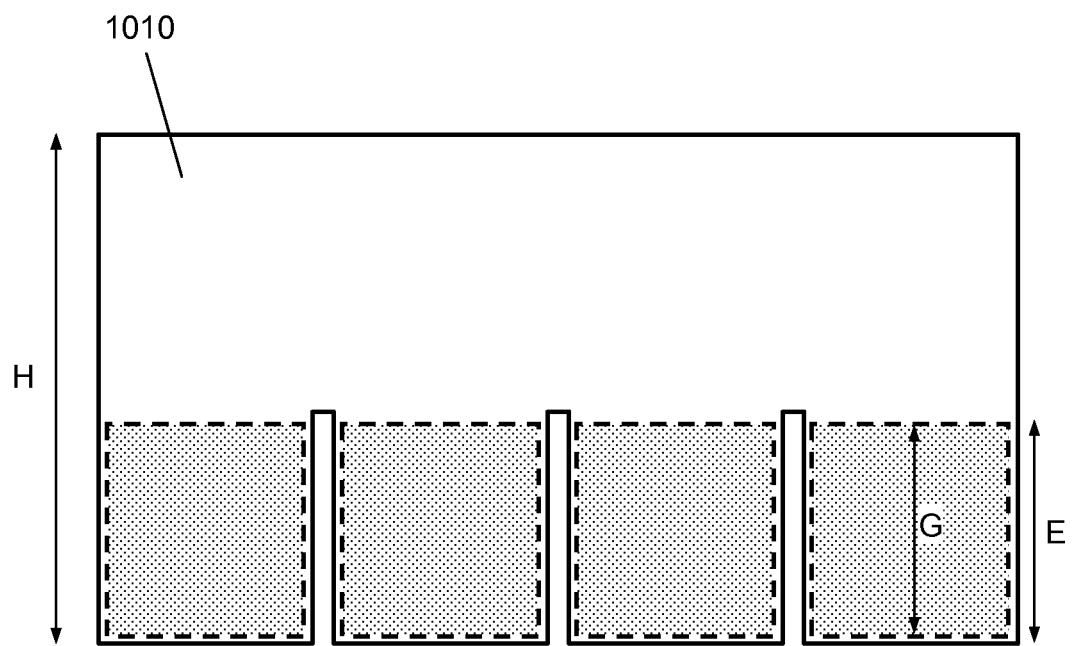
FIG. 10 is a top schematic view of a flexible roofing substrate according to one embodiment of the invention.

In certain embodiments, the flexible roofing substrate has a height (i.e., measured in the direction going up the roof as installed) of about eighteen inches (for example, in the range of 17 inches to 19 inches, in the range of 17.5 inches to 18.5 inches, or even in the range of 17.7 inches to 18.3 inches). One such embodiment is shown in FIG. 10; flexible roofing substrate 1010 is a shingle having a height "H" of about 18 inches. For example, a shingle dimension of 18"×36" can be used. In certain embodiments, the flexible roofing substrate can have an exposure area (i.e., the area exposed as installed) having exposure height (i.e., height of the exposed area as installed, shown as "E" in FIG. 10) of about eight inches (for example, in the range of 7 inches to 9 inches, in the range of 7.5 inches to 8.5 inches, or even in the range of 7.7 inches to 8.3 inches). The flexible roofing substrate can, for example, be a shingle having multiple tabs in its exposure area, as shown in FIG. 10, or can be substantially continuous. As the person of skill in the art will appreciate, the shingle can be of single- or multiple layer construction. In certain embodiments, the one or more granule-coated zones of the flexible roofing substrate area are disposed substantially within the exposure area. In one embodiment, the one or more granule-coated zones can have a height (shown as "G" in FIG. 10) of about eight inches (for example, in the range of 7 inches to 9 inches, in the range of 7.5 inches to 8.5 inches, or even in the range of 7.7 inches to 8.3 inches). In certain embodiments, the granule-coated zone has a height that is slightly less than or equal to (e.g., in the range of zero to one inch, in the range of zero to 0.5 inches, or even in the range of 0 to 0.3 inches less than) the height of the exposure area. In other embodiments, the height of the granule-coated zone is somewhat greater than (e.g., in the range of zero to 0.5 inches, or even zero to 1.0 inches) the height of the exposure area.

The use of flexible roofing substrates having heights of about eighteen inches, optionally with exposure heights of about eight inches and/or granule-coated zones having heights of about eight inches can result in a number of advantages. For example, such configurations can result in desirable natural-appearing effects, similar to those of certain standard roofing shingles. Moreover, these configurations can require relatively few nails per square of roofing material, require the installation of relatively few flexible roofing elements per square of roofing material, result in material and labor savings, allow for the ready manufacture of flexible roofing substrates from sheets of material that are originally about 36 inches wide, and result in efficient loading on standard 36 inch pallets. Moreover, use of exposure areas and/or granule-coated zones having heights of about eight inches can result in more efficient use of photovoltaic elements, as compared to systems based on standard roofing elements having a twelve inch height and an exposure area having a height of five inches, as fewer individual photovoltaic elements are required to outfit an equivalent roof area. Similarly, less time can be spent installing and wiring photovoltaic elements as compared to systems based on standard roofing elements having a twelve inch height and an exposure area having a height of five inches, as fewer photovoltaic elements would need to be installed and fewer wiring connections would need to be made per unit area. Moreover, shingles substantially larger than eighteen inches in height can be difficult for a single worker to handle on the roof with any wind present. Use of roofing elements having heights of about eighteen inches, exposure zones having heights of about eight inches, and/or granule-coated zones having heights of about eight inches, as described above, and/or photovoltaic elements having heights of about eight inches, as described in more detail below, can advantageously be used in conjunction with any appropriate embodiments described herein.

As noted above, the roofing product further includes an adhesive suitable for securing a photovoltaic element to one or more of the granule-coated zones. The adhesive is capable of forming a bond to the granules and the top surface of the flexible roofing substrate and to the bottom surface of the photovoltaic element. When it is applied to the granule-coated zones, an adhesive desirably is of sufficient length and width to correspond to the dimensions of the lower surface of a photovoltaic element, and is of sufficient thickness and character to provide a suitable bond between the photovoltaic element and the flexible roofing substrate. Especially suitable adhesives provide sufficient bond strength to join the bottom surface of the photovoltaic element to the top surface of the flexible roofing substrate, and should be able to withstand severe outdoor weathering. In one embodiment of the invention, the adhesive provides greater than 10 lb/inch adhesive bond strength in a 90° peel test. In certain embodiments, the adhesive maintains the bond strength in severe outdoor conditions for an extended period of time, e.g., 20 years of service life. The adhesive can, for example, meet the humidity-freeze cycle test, thermal cycle test, and damp-heat test requirements listed in IEC 1646. Moreover, in certain embodiments the materials of the adhesive can flexibly be incorporated through use of a variety of adhesive processes.

In certain desirable embodiments, the adhesive can be applied to the granule-coated zone of the roofing product such that it fills in between the granules and forms a bond with the roofing product, as well as with the photovoltaic element to be applied over it. In one embodiment, the adhesive sets at ambient conditions. In another embodiment, heat can optionally be employed to accelerate the setting of the adhesive. In certain embodiments, the rheological behavior of the adhesive is such that it flows into place and remains in position on the granule-coated zone of the roofing product without slumping or sagging on a sloped roof installation, either before or after the installation of the photovoltaic element. In some embodiments, the adhesive is applied to the granule-coated zone of the roofing product surface in a liquid or semiliquid state.

There are a great variety of adhesives that are suitable for use in various embodiments and aspects of the present invention. For example, adhesive can be a self-adhesive tape (e.g., butyl, ethylene-propylene adhesives); a reactive pressure sensitive adhesive including a microencapsulated curing agent; or a settable adhesive such as an adhesive caulk like butyl adhesive, a two part reactive polyurethane, a reactive epoxy, a room temperature vulcanizable silicone, a moisture curable urethane, or the like. For example, U.S. Reissue Pat. No. RE 39,764 discloses a one-part, moisture-curable, foaming polyurethane adhesive useful for roof structures. U.S. Pat. No. 7,234,284 discloses an adhesive for use in roofing construction comprising an asphalt, a polymer, a tackifier, and a plasticizer. United States Patent Application Publication no. 2005/0246991A1 describes a one component, moisture curable, isocyanate terminated adhesive composition for adhering a polymeric sheet to a substrate. U.S. Pat. No. 6,852,185 discloses a method of securing shingles to a roof with a two part polyurethane adhesive. U.S. Pat. No. 5,872,203 describes a 100% solids polyurethane adhesive composition for bonding polymeric roofing materials to roof-deck substrates which includes two components. U.S. Pat. No. 5,421,876 discloses a solvent free, organo-clay filled asphaltic polyurethane dispersion that is stable and moisture curable to an elastomer having excellent adhesion and weather resistance especially used as roofing adhesive. U.S. Pat. Nos. 4,755,545, 4,923,913 and 5,011,726 disclose bituminous adhesives that can be used with roofing shingles. International Patent Application Publication no. WO83/00520A1 discloses a curable silicone elastomer based roofing system. U.S. Pat. No. 4,026,853 discloses a curable bituminous organosiloxane composition. U.S. Pat. No. 3,980,597 discloses a moisture curable polyurethane sealant composition suitable for roofs. U.S. Pat. No. 3,637,558 discloses elastomeric compositions from asphalt and partially uncured urethanes of allylic hydroxyl-terminated diene polymers. U.S. Pat. No. 3,372,083 discloses compositions and articles from the reaction of an isocyanate terminated polyurethane and the isocyanate adduct of bitumen. Certain suitable adhesives are described in U.S. Patent Application Publication no. 2009/0133340 A1. Each of the above-referenced publications and patents is hereby incorporated herein by reference in its entirety.

The adhesive can be applied to the flexible roofing substrate in a variety of ways. For example, an applicator can be used to deliver liquid adhesive components to the flexible roofing substrate. In an example of an applicator for a two-part adhesive, two cartridges separately deliver reactive components through a funnel portion to a static mixer and then to a nozzle of appropriate dimension to correspond to the width of the photovoltaic element. U.S. Pat. No. 4,253,566, which is hereby incorporated by reference in its entirety, discloses a resin-containing cartridge system capable of mixing and applying a multicomponent reactive adhesive system. It will also be understood that a one component adhesive could also be used with an appropriate applicator. The adhesive could be a moisture cure adhesive that begins to cure once it is applied to the flexible roofing substrate. The adhesive could also comprise a two part adhesive package where one part is applied to the flexible roofing substrate with an applicator and the other part is applied to the bottom surface of the photovoltaic element, the two parts reacting when photovoltaic element is brought together with the flexible roofing substrate. In other embodiments, the adhesive is manually applied to the flexible roofing substrate.

In certain embodiments, the adhesive is provided as part of the photovoltaic element, for example, as a release liner-covered layer on the bottom of the photovoltaic element. In other embodiments, the adhesive is separate, and applied separately to the flexible roofing substrate.

In another aspect, the adhesive is applied to the granule-coated zone of the roofing product surface as a preformed conformable adhesive strip. In certain embodiments, the adhesive has a composite structure comprising a layer of pressure sensitive adhesive and a layer of deformable material. For example, the deformable material can be sandwiched between layers of adhesive material. The deformable material can allow for more economical usage of a higher performance, higher cost pressure sensitive adhesive. The use of deformable layers to improve contact between pressure sensitive adhesives and irregular surfaces is disclosed in U.S. Pat. No. 5,310,278, which is hereby incorporated herein by reference in its entirety. The adhesive materials can be supplied as a transfer adhesive protected with a releasable liner; the releasable liner can be removed (e.g., by peeling) to expose the adhesive for attachment to the granule-coated zone surface of the flexible roofing substrate. In one embodiment, the structure has two release liners; one protecting the top adhesive surface and the other protecting the bottom adhesive surface. In another embodiment, the self-adhesive layer has a single dual release liner such that, when provided in a roll form (for example), the protective liner is sandwiched between the top adhesive surface of one layer of the roll and the bottom adhesive surface of an adjacent layer of the roll. Alternatively, a single liner can be folded around the structure to cover both top and bottom adhesive surfaces. In use, an adhesive surface is pressed into intimate contact with the granule-coated surface to bond with the flexible roofing substrate. The thickness of and deformable nature of the interlayer between the top and bottom adhesive materials allows for good contact between the adhesive and the granule covered flexible roofing substrate. The remaining release liner is removed and the photovoltaic module is adhered thereto, for example, in a separate operation occurring some time after the adhesion of the structure to the granule-coated zone of the roofing substrate. Optionally, the photovoltaic module may include another adhesive material on the bottom surface thereof. The chemistry of the upper and lower adhesive surfaces of the self-adhesive layer may be the same or different. U.S. Pat. No. 4,273,827, which is hereby incorporated herein by reference in its entirety, discloses a preformed adhesive assembly suitable for attachment of disparate surfaces on to another. Similarly, U.S. Pat. No. 4,356,676, which is hereby incorporated herein by reference in its entirety, describes a preformed conformable adhesive structure.

A preformed adhesive structure that is commercially available is EternaBond DoubleStick® from EternaBond (Mundelein, Ill.). The self sealing adhesive is used to create a water tight, conformable seal between two or more irregular surfaces and/or a weather proof, permanent bond between two or more similar or dissimilar surfaces. The tape utilizes a 100% solids formulation of synthetic resins, thermoplastics, non-curing rubbers, with a built in primer, sandwiched between two siliconized release liners. Optionally, a primer may be applied to the surface of the granule covered flexible roofing substrate prior to application of the DoubleStick® tape. The first liner is stripped from the tape and it is applied to the granule-coated roofing substrate and tamped in place. The second liner is removed and a photovoltaic element is attached thereto.

An adhesive can act to adhere the photovoltaic element to the granule-coated zone of the flexible roofing element when they are formed of partially incompatible materials (for example, when the photovoltaic element is an encapsulated photovoltaic element having a fluoropolymer at its bottom surface). In one embodiment of the invention, the adhesive consists essentially of a single polymer layer having a surface tension in the range of about 25% to about 75% of the way between the surface tension value of the granule-coated zone of the roofing element and the surface tension value of the bottom surface of the photovoltaic element.

In one embodiment of the invention, the adhesive includes a polymeric material having a Chang viscoelastic window exhibiting at least one set of coordinates ($\log(G")$, $\log(G')$) lying within the window bound by the coordinates (4.5, 3), (4.5, 6), (6, 6), (6, 3) (e.g., pressure sensitive adhesives). In certain embodiments of the invention, the polymeric material has a Chang viscoelastic window exhibiting at least one set of coordinates ($\log(G")$, $\log(G')$) lying within the window bound by the coordinates (4.5, 6), (6, 6), (6, 3.7). In other embodiments of the invention, the polymeric material has a Chang viscoelastic window exhibiting at least one set of coordinates ($\log(G")$, $\log(G')$) lying within the window bound by the coordinates (4.5, 6), (4.5, 8), (8, 8), (8, 3.7), (6, 3.7). In other embodiments of the invention, the polymeric material has a Chang viscoelastic window exhibiting at least one set of coordinates ($\log(G")$, $\log(G')$) lying within the window bound by the coordinates (4.5, 6), (4.5, 8), (8, 8), (8, 3.7), (6, 3.7), (6, 6). $G"$ is the viscous shear modulus in units of Pa, and $G'$ is the elastic shear modulus in units of Pa. $G$ and $G"$ can be measured as described in ASTM 882-97, for example at frequencies of 0.01 R/S and 100 R/S. Dissipative materials generally have Chang viscoelastic window coordinates within the above-referenced windows. Such materials are described in more detail in U.S. Pat. No. 6,869,981, and at pages 171-184 of Handbook of Pressure Sensitive Adhesive Technology, 3rd Ed., D. Satas editor, 1999, each of which is hereby incorporated herein by reference in its entirety; the UV curable materials described therein can be converted to heat-curable materials by changing initiators. Other examples include VHB adhesive materials available from 3M.

In certain embodiments of the invention, the adhesive has a coefficient of thermal expansion ("CTE") between the CTE of the granule-coated zone of the flexible roofing substrate and the CTE of the bottom surface of the photovoltaic element, measured at 100° F. In one embodiment of the invention, the adhesive has a CTE in the range of about 25% to about 75% of the way between the CTE of the granule-coated zone of the flexible roofing substrate and the CTE of the bottom surface of the photovoltaic element, measured at 100° F. In one embodiment of the invention, the granule-coated zone of the roofing element is bitumen-based with a CTE of $\sim 2.5 \times 10^{-4}$ in/in/° F. As the person of skill will appreciate, the thermal expansion behavior of the granule-coated zone will be determined chiefly by the material in which the granules are embedded, and not the individual granules themselves.

In certain embodiments of the invention, the adhesive is not conductive. In such embodiments, the photovoltaic elements do not require additional grounding to prevent electric shock or to meet electrical code requirements.

In other embodiments of the invention, the adhesive includes an amino-substituted organosilane layer, for example as described in U.S. Pat. No. 6,753,087, which is hereby incorporated herein by reference. For example, the adhesive can include a polymeric layer (e.g., having polar functionality) having blended therein an amino-substituted organosilane.

The thickness of the adhesive can be, for example, in the range of about 25 µm to about 2.5 mm. In certain embodiments of the invention, the thickness of the adhesive is in the range of about 50 µm to about 1 mm.

Photovoltaic elements suitable for use in conjunction with the roofing products of the invention, and in the photovoltaic roofing elements, systems, methods and kits of the invention comprise one or more interconnected photovoltaic cells provided together in a single package. The photovoltaic cells of the photovoltaic elements can be based on any desirable photovoltaic material system, such as monocrystalline silicon; polycrystalline silicon; amorphous silicon; III-V materials such as indium gallium nitride; II-VI materials such as cadmium telluride; and more complex chalcogenides (group VI) and pnicogenides (group V) such as copper indium diselenide. For example, one type of suitable photovoltaic cell includes an n-type silicon layer (doped with an electron donor such as phosphorus) oriented toward incident solar radiation on top of a p-type silicon layer (doped with an electron acceptor, such as boron), sandwiched between a pair of electrically-conductive electrode layers. Another type of suitable photovoltaic cell is an indium phosphide-based thermo-photovoltaic cell, which has high energy conversion efficiency in the near-infrared region of the solar spectrum. Thin film photovoltaic materials and flexible photovoltaic materials can be used in the construction of photovoltaic elements for use in the present invention. In one embodiment of the invention, the photovoltaic element includes a monocrystalline silicon photovoltaic cell or a polycrystalline silicon photovoltaic cell. The photovoltaic elements for use in the present invention can be flexible, or alternatively can be rigid.

The photovoltaic elements can be encapsulated photovoltaic elements, in which photovoltaic cells are encapsulated between various layers of material. For example, an encapsulated photovoltaic element can include a top layer material at its top surface, and a bottom layer material at its bottom surface. The top layer material can, for example, provide environmental protection to the underlying photovoltaic cells, and any other underlying layers. Examples of suitable materials for the top layer material include fluoropolymers, for example ETFE ("TEFZEL"), PFE, FEP, PVF ("TEDLAR"), PCTFE or PVDF. The top layer material can alternatively be, for example, a glass sheet, or a non-fluorinated polymeric material. The bottom layer material can be, for example, a fluoropolymer, for example ETFE ("TEFZEL"), PFE, FEP, PVDF or PVF ("TEDLAR"). The bottom layer material can alternatively be, for example, a polymeric material (e.g., polyester such as PET); or a metallic material (e.g., steel or aluminum sheet). In certain embodiments of the invention, the photovoltaic element is built on a flexible steel substrate, as described, for example, in U.S. Pat. No. 5,457,057, which is hereby incorporated by reference in its entirety. In such embodiments, the photovoltaic cells can be formed from amorphous silicon.

Figure 11:
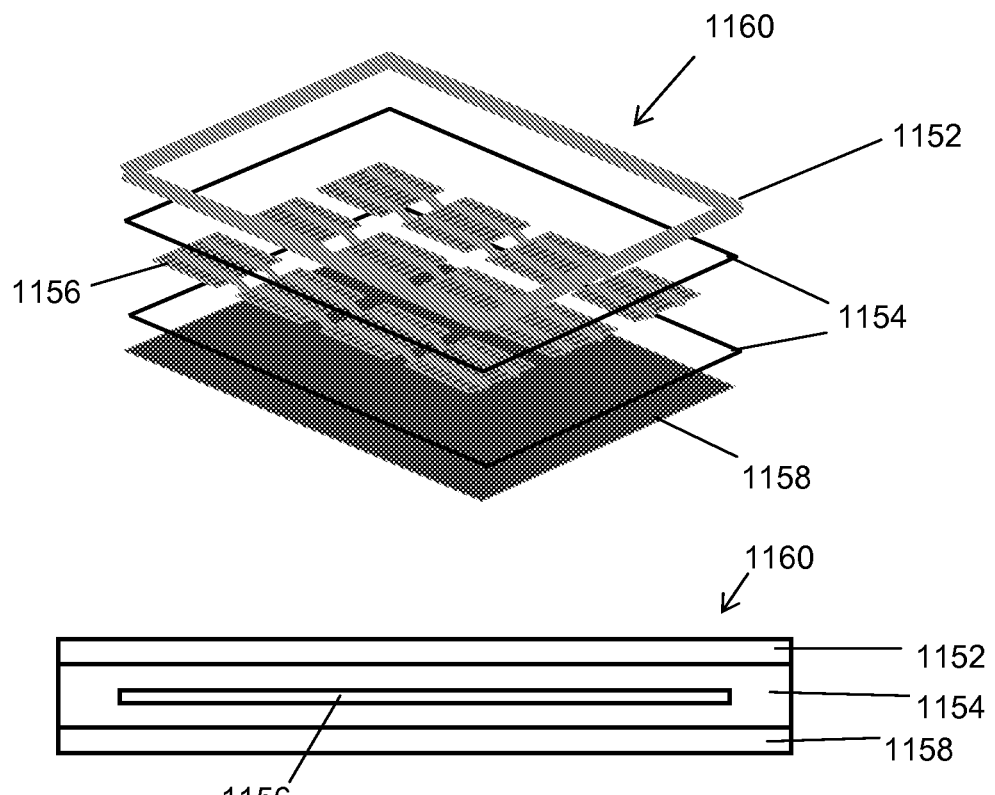
FIG. 11 is an exploded schematic perspective view of an encapsulated photovoltaic roofing element for use in the present invention.

As the person of skill in the art will appreciate, an encapsulated photovoltaic element can include other layers interspersed between the top layer material and the bottom layer material. For example, an encapsulated photovoltaic element can include structural elements (e.g., a reinforcing layer of glass, metal or polymer fibers, or a rigid film); adhesive layers (e.g., EVA to adhere other layers together); mounting structures (e.g., clips, holes, or tabs); one or more electrical connectors (e.g., electrodes, electrical connectors; optionally connectorized electrical wires or cables) for electrically interconnecting the photovoltaic cell(s) of the encapsulated photovoltaic element with an electrical system. An example of an encapsulated photovoltaic element suitable for use in the present invention is shown in schematic exploded view and schematic cross sectional view in FIG. 11. Encapsulated photovoltaic element 1160 includes a top protective layer 1152 (e.g., glass or a fluoropolymer film such as ETFE, PVDF, PVF, FEP, PFA or PCTFE); encapsulant layers 1154 (e.g., EVA, functionalized EVA, crosslinked EVA, silicone, thermoplastic polyurethane, maleic acid-modified polyolefin, ionomer, or ethylene/(meth)acrylic acid copolymer); a layer of electrically-interconnected photovoltaic cells 1156; and a backing layer 1158 (e.g., PVDF, PVF, PET).

A photovoltaic element having a self-adhesive layer on its bottom surface can be suitable for use in the present invention. In certain embodiments, such a photovoltaic element provides the adhesive that adheres the photovoltaic element to the granule-coated zone. In other embodiments, the adhesive of the photovoltaic element adheres to an adhesive already disposed in the granule-coated zone. In one example, the self-adhesive layer is a 3-10 mil thick layer of a butyl rubber-based or rubber resin pressure sensitive adhesive. Suitable rubber resin pressure sensitive adhesives are disclosed, for example, in U.S. Pat. No. 3,451,537, which is hereby incorporated herein by reference in its entirety. Other photovoltaic elements and adhesive systems suitable for use in the present invention are described in U.S. Pat. Nos. 6,729,081 and 6,553,729, each of which is hereby incorporated herein by reference in its entirety. In certain embodiments, the adhesive on the bottom surface of the photovoltaic element has a composite structure comprising a layer of pressure sensitive adhesive and a layer of deformable material. The deformable material can allow for more economical usage of a higher performance, higher cost pressure sensitive adhesive. The use of deformable layers to improve contact between pressure sensitive adhesives and irregular surfaces is disclosed in U.S. Pat. No. 5,310,278, which is hereby incorporated herein by reference in its entirety. The self-adhesive layer can be protected with a releasable liner; the releasable liner can be removed (e.g., by peeling) to expose the adhesive for attachment to the granule-coated zone of a flexible roofing substrate.

The photovoltaic element can include at least one antireflection coating, for example as the top layer material in an encapsulated photovoltaic element, or disposed between the top layer material and the photovoltaic cells. In other embodiments, the photovoltaic element can include, for example, a lenticular element, such as that described in International Patent Application Publication no. WO 2007/085721, which is hereby incorporated herein by reference in its entirety; or a decorative and/or colored overlay, such as that described in U.S. Patent Application Publication no. 2009/0000221, which is hereby incorporated herein by reference in its entirety. The removable cover elements can be removed after installation to expose the photovoltaically active areas. Moreover, in embodiments in which a roofing coating is disposed on roof (e.g., as described below with reference to FIG. 19), the removable cover elements can be removed after the roofing coating is applied. In such embodiments, the roofing coating can be applied over the entire roof, and can help to waterproof the seams between the photovoltaic elements and the flexible roofing substrates.

Suitable photovoltaic elements can be obtained, for example, from China Electric Equipment Group of Nanjing, China, as well as from several domestic suppliers such as United Solar Ovonic, Sharp, Shell Solar, BP Solar, USFC, FirstSolar, General Electric, Schott Solar, Evergreen Solar and Global Solar. Moreover, the person of skill in the art can fabricate encapsulated photovoltaic elements using techniques such as lamination or autoclave processes. Encapsulated photovoltaic elements can be made, for example, using methods disclosed in U.S. Pat. No. 5,273,608, which is hereby incorporated herein by reference.

The top surface of a photovoltaic element is the surface presenting the photoelectrically-active areas of its one or more photoelectric cells. When installed, the photovoltaic roofing elements of the present invention should be oriented so that the top surface of the photovoltaic element is able to be illuminated by solar radiation. The bottom surface is the surface opposite the top surface.

The photovoltaic element also has an operating wavelength range. Solar radiation includes light of wavelengths spanning the near UV, the visible, and the near infrared spectra. As used herein, the term "solar radiation," when used without further elaboration means radiation in the wavelength range of 300 nm to 2500 nm, inclusive. Different photovoltaic elements have different power generation efficiencies with respect to different parts of the solar spectrum. Amorphous doped silicon is most efficient at visible wavelengths, and polycrystalline doped silicon and monocrystalline doped silicon are most efficient at near-infrared wavelengths. As used herein, the operating wavelength range of a photovoltaic element is the wavelength range over which the relative spectral response is at least 10% of the maximal spectral response. According to certain embodiments of the invention, the operating wavelength range of the photovoltaic element falls within the range of about 300 nm to about 2000 nm. In certain embodiments of the invention, the operating wavelength range of the photovoltaic element falls within the range of about 300 nm to about 1200 nm.

In certain embodiments, the photovoltaic elements are provided with removable cover elements covering their photovoltaically-active areas, as described in United States Patent Application Publication no. 2009/0000221, which is hereby incorporated herein by reference in its entirety. The removable cover elements can be removed after installation to expose the photovoltaically active areas.

Figure 12:
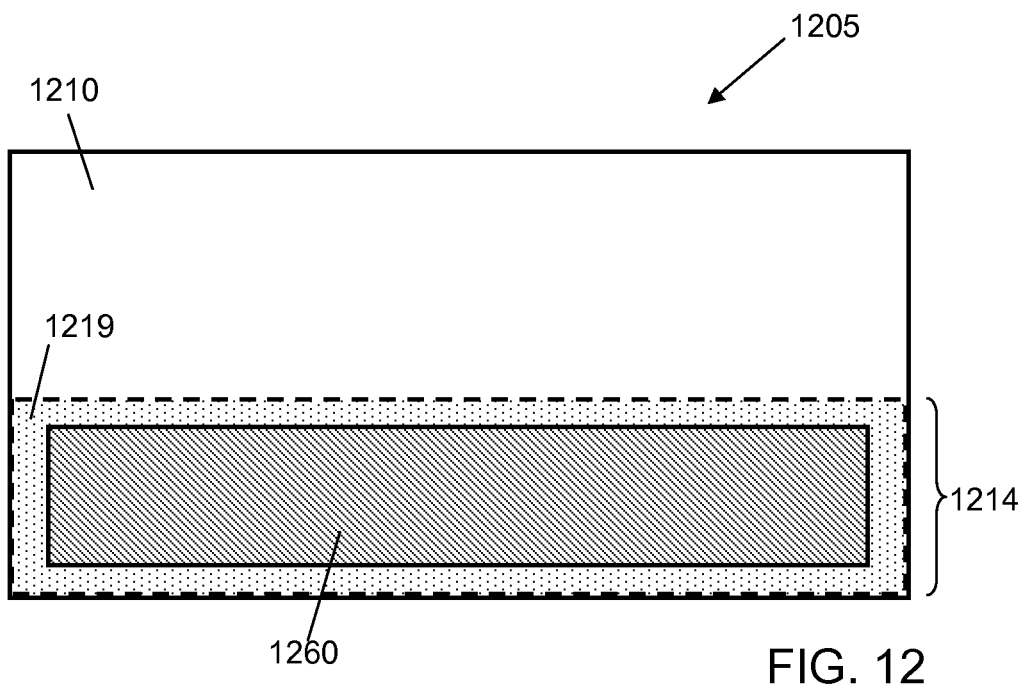
FIG. 12 is a schematic top view.
Figure 13:
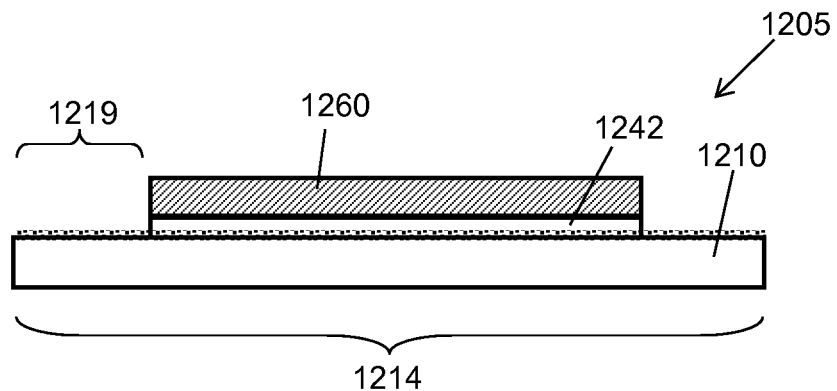
FIG. 13 is a schematic cross-sectional view of a photovoltaic element according to one embodiment of the invention.

Another embodiment of the invention is a photovoltaic roofing element, including the roofing product as described above, with the adhesive disposed in one or more of the granule-coated zones. One or more photovoltaic elements is disposed on the adhesive in the one or more granule-coated zones of the top surface of the flexible roofing substrate. In certain embodiments, at least some of the granule-coated zones remain exposed as exposure zones. One embodiment is shown in top schematic view in FIG. 12, and in schematic cross-sectional view in FIG. 13. Photovoltaic roofing element 1205 includes flexible roofing substrate 1210, which has a granule-coated zone 1214. Disposed in the granule-coated zone 1214 is adhesive 1242, which adheres photovoltaic element 1260 to the flexible roofing substrate. In this embodiment, a portion 1219 of the granule-coated zone remains exposed as an exposure zone.

While in many embodiments the adhesive is sufficient to hold the photovoltaic element in place on the flexible roofing substrate, it can often be desirable to use a mechanical fastener is used together with the adhesive in the attachment of the photovoltaic elements to the flexible roofing substrate. The mechanical fastener can be, for example, nails, staples, screws, clips or the like; such fasteners can attach the photovoltaic element only to the flexible roofing substrate on which it is disposed, or can go through the flexible roofing substrate down to underlying flexible roofing substrates, or even through to the roof deck itself. The mechanical fastener can provide for additional security of attachment of the photovoltaic element under conditions of steep slope or high temperature, where an adhesive may be subject to shear stresses. The mechanical attachment can be particularly helpful on the lower edge of the photovoltaic element to prevent sliding movement down the roof. Moreover, mechanical attachment at the lower edge may impart added resistance to wind uplift detachment of the photovoltaic element or the flexible roofing substrate. Mechanical attachment at one edge of the photovoltaic element can also allow a degree of movement within the tie layer system to accommodate differential thermal expansion and contraction between the photovoltaic element and the flexible roofing substrate.

Figure 14:
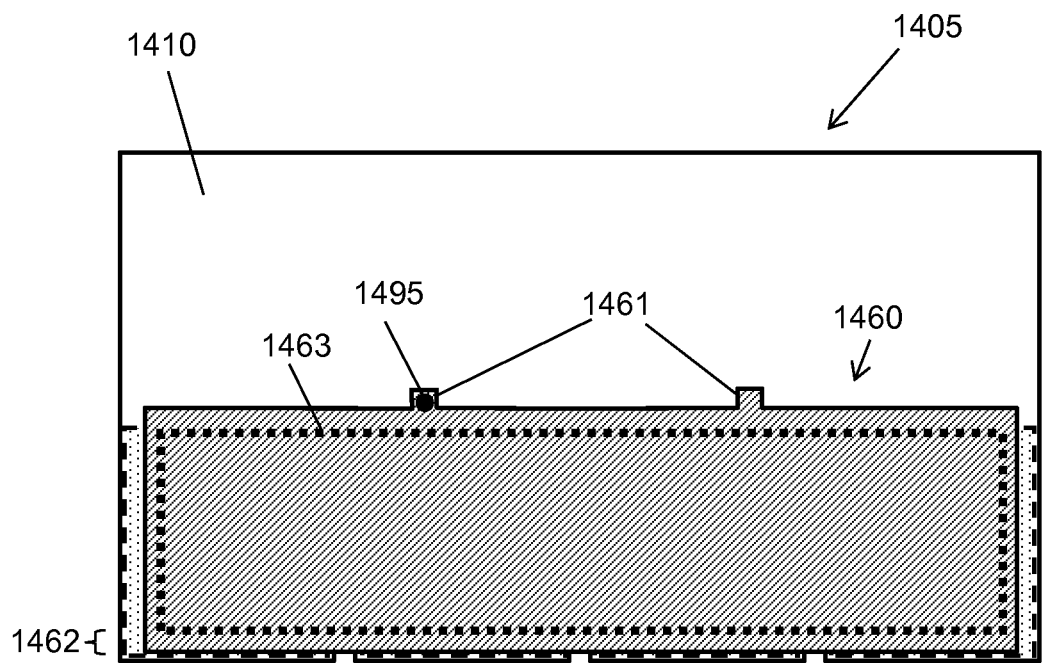
FIG. 14 is schematic top view of a photovoltaic element according to one embodiment of the invention.

In some embodiments, the photovoltaic element will include fastening tabs or a fastening zone (e.g., a marked area) to aid in the attachment of the photovoltaic element to the granule-coated zone of the flexible roofing substrate. Fastening zones and tabs may be configured using a flexible material, such as described in U.S. Pat. Nos. 5,729,946, 5,857,303, 5,887,743, 5,857,303 and 6,000,185, each of which is hereby incorporated by reference in its entirety. Flexible fastening zones can help to accommodate movement between the photovoltaic element and the flexible roofing substrate, for example due to differential thermal expansion. For example, in one example of a photovoltaic roofing element 1405 of the invention, shown in top schematic view in FIG. 14, photovoltaic element 1460 (having photovoltaically active area 1463) is disposed in the granule-coated zones of flexible roofing substrate 1410. Photovoltaic element 1460 includes both fastening tabs 1461 and a fastening zone 1462. The fastening tabs 1461 and fastening zone 1462 denote places that where fastening will cause no damage to the photovoltaic element (e.g., areas devoid of photovoltaic cells or electrical components such as wiring). The fastening tabs can in some embodiments be covered by an overlying course of flexible roofing substrates (e.g., shingles). In certain embodiments, the photovoltaic element includes fastening tabs (e.g., as denoted by 1461 in FIG. 14), but no other fastening zone. A fastener 1495 is shown attaching the photovoltaic element 1460 to the roofing substrate.

Figure 15:
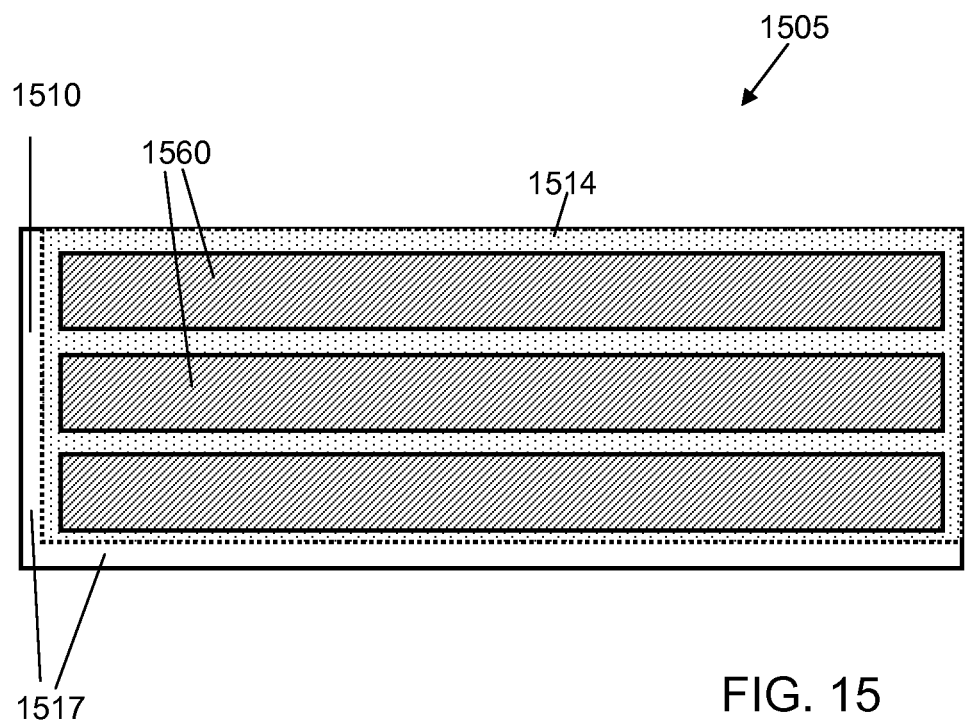
FIG. 15 is a top schematic view of a photovoltaic roofing element according to one embodiment of the invention.

In certain embodiments of the photovoltaic roofing elements, more than one photovoltaic element is disposed on each granule-coated zone. For example, a photovoltaic roofing element 1505 according to one embodiment of the invention is shown in top schematic view in FIG. 15. Photovoltaic roofing element includes a roofing membrane 1510, with a granule-coated zone 1514 that covers the entire membrane except for two edges 1517 (for example, as described above with respect to FIG. 9). Three photovoltaic elements 1560 (e.g., in the form of strips of encapsulated photovoltaic elements) are adhered to the single granule coated zone 1514 with an adhesive (not shown). In certain embodiments, and as shown in FIG. 15, the photovoltaic elements can be arranged with some exposed area between them; in such embodiments, the granule-coated zone can provide a desired appearance and weather durability to the exposed area between photovoltaic elements. In other embodiments, the photovoltaic elements can be contiguously arranged.

Figure 16:
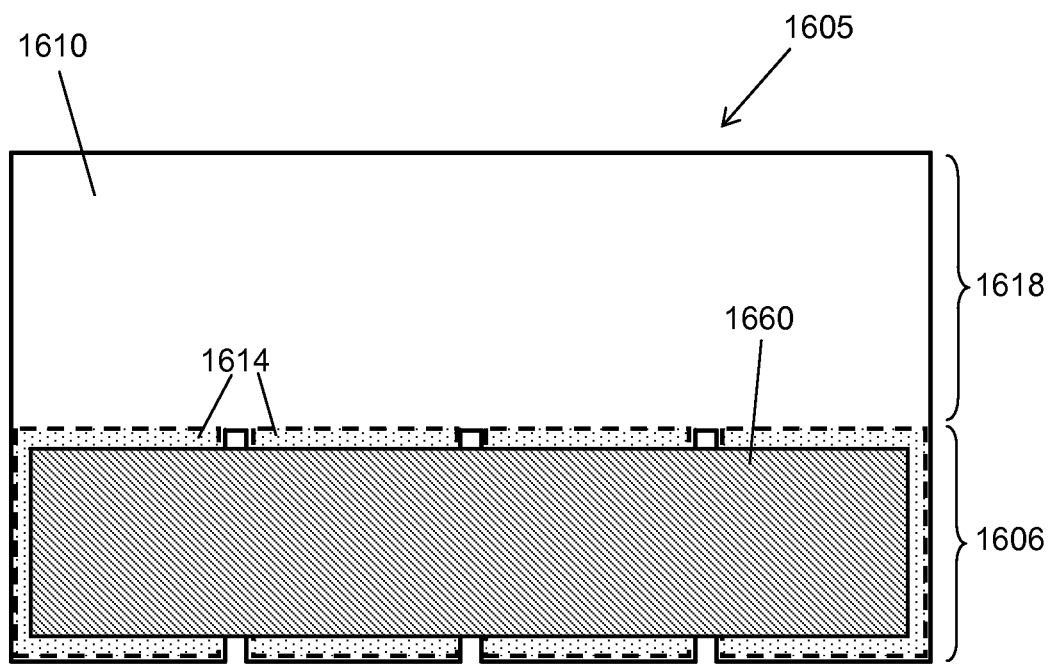
FIG. 16 is a top schematic view of a photovoltaic roofing element according to one embodiment of the invention.

In other embodiments, a single photovoltaic element extends across multiple granule-coated zones. For example, in the embodiment shown in top schematic view in FIG. 16, photovoltaic roofing element 1605 includes a flexible roofing substrate 1610, which includes a plurality of tabs 1606 extending from headlap zone 1618. Each tab 1606 has a granule-coated zone 1614 formed thereon. A photovoltaic element 1660 is adhered to the four granule coated zones 1614 with an adhesive (not shown). The photovoltaic element can be, for example, a strip of four electrically interconnected T-cell photovoltaic elements in a laminate structure, with a pressure-sensitive adhesive on the bottom surface of the laminate structure.

In certain photovoltaic elements of the invention, at least about 70%, at least about 80%, or even at least about 90% of the total granule-coated zone area of a flexible roofing substrate is covered by photovoltaic elements.

In embodiments in which multiple photovoltaic elements are disposed adjacent to one another in a granule-coated zone, waterproofing may be provided via an optional bead of an adhesive, caulk or other sealant between adjacent photovoltaic elements. Alternatively, a pressure sensitive adhesive tape with a backing layer stabilized for outdoor performance can be used to seal the seams between adjacent photovoltaic elements.

In certain embodiments, the flexible roofing substrate of the photovoltaic roofing element has a height of about eighteen inches, as described above. In certain such embodiments, the flexible roofing element has an exposure area having an exposure height of about eight inches, as described above; one or more granule-coated zones having a height of about eight inches, as described above; or both. The photovoltaic element can similarly have a height (measured in the direction going up the roof as installed) of about eight inches (for example, in the range of 7 inches to 9 inches, in the range of 7.5 inches to 8.5 inches, or even in the range of 7.7 inches to 8.3 inches). The use of photovoltaic elements having heights of about eight inches can result in more efficient use of photovoltaic elements, as compared to systems based on standard roofing elements having a twelve inch height and an exposure area having a height of five inches, as fewer photovoltaic elements are required to outfit an equivalent roof area. Similarly, less time can be spent installing and wiring photovoltaic elements as compared to systems based on standard roofing elements having a twelve inch height and an exposure area having a height of five inches, as fewer photovoltaic elements would need to be installed and fewer wiring connections would need to be made per unit area. Moreover, shingles substantially larger than eighteen inches in height can be difficult for a single worker to handle on the roof with any wind present. Similarly, photovoltaic elements eight inches in height (especially in roll form) can be of a convenient size for handling on a roof, especially on a pitched roof where balance can be difficult making larger photovoltaic elements unwieldy. Moreover, photovoltaic elements having a height of about eight inches can be conveniently fabricated from a roll of flexible steel material (see, e.g., U.S. Pat. No. 5,457,057) having a width of about 15 inches; amorphous silicon-based cells can be deposited onto the flexible steel material, which can be cut lengthwise into about 7.5 inch wide strips, which when packaged and encapsulated can be about eight inches in height. Accordingly, photovoltaic elements about eight inches in height can efficiently use the entire width of the 15 inch flexible steel substrate commonly used in the fabrication of photovoltaic devices.

Figure 17:
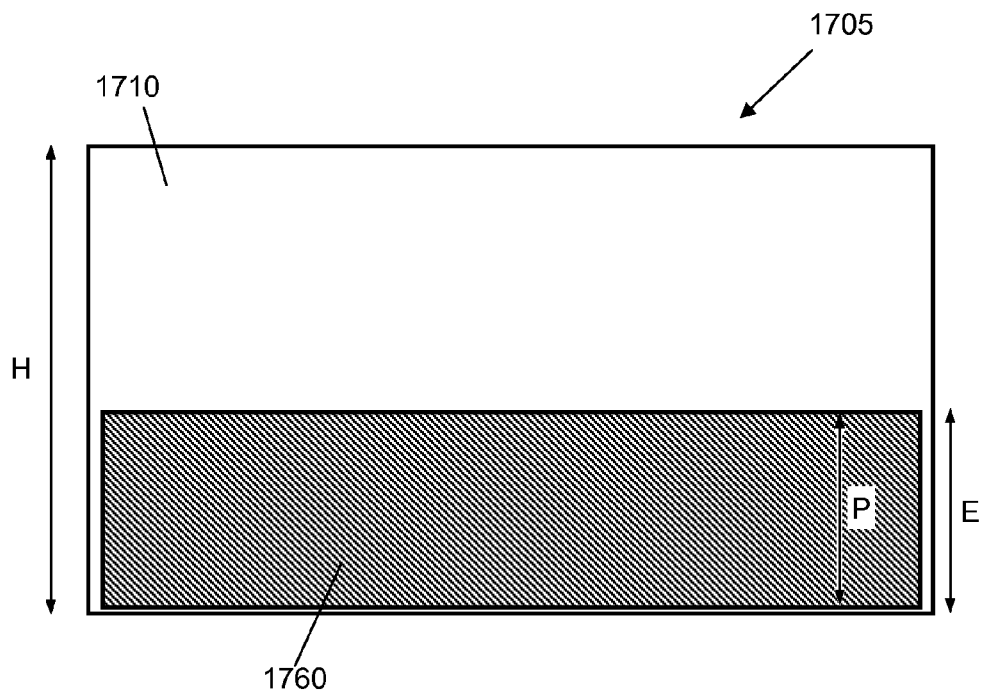
FIG. 17 is a top schematic view of a photovoltaic roofing element according to one embodiment of the invention.

An example of such a photovoltaic roofing element is shown in top schematic view in FIG. 17. Photovoltaic roofing element 1705 includes a roofing substrate 1710, which has a height "H" of about 18" (e.g., in the range of 17 inches to 19 inches, in the range of 17.5 inches to 18.5 inches, or even in the range of 17.7 inches to 18.3 inches), and a top surface having an exposure area of height "E" of about eight inches (e.g., in the range of 7 inches to 9 inches, in the range of 7.5 inches to 8.5 inches, or even in the range of 7.7 inches to 8.3 inches). Disposed in the exposure area (in a granule-coated zone, adhered with adhesive, not shown) is photovoltaic element 1760 having a height "P" of about eight inches (e.g., in the range of 7 inches to 9 inches, in the range of 7.5 inches to 8.5 inches, or even in the range of 7.7 inches to 8.3 inches). Of course, in other embodiments, the photovoltaic roofing element can be built with "tabs," as is conventional in the art and shown in FIGS. 5, 10 and 16, or in some other configuration.

Figure 18:
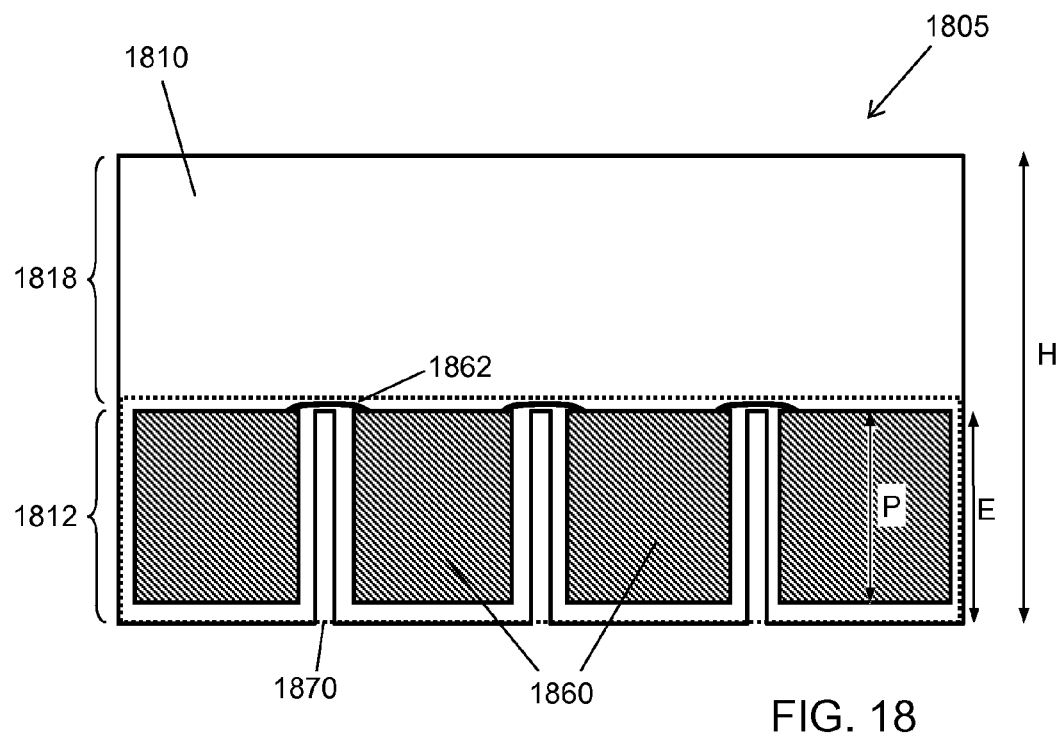
FIG. 18 is a top schematic view of a photovoltaic roofing element according to another embodiment of the invention.

Another embodiment of the invention is shown in top schematic view in FIG. 18. Photovoltaic roofing element 1805 includes a flexible roofing substrate 1810, having an overall height "H", an exposure area 1812 having a height "E", and a headlap area 1818. One or more photovoltaic elements 1860, having height "P" are disposed (in a granule-coated zone, adhered with adhesive, not shown) in the exposure area. The photovoltaic elements 1860 can be interconnected, for example, by jumper wires 1862. The photovoltaic roofing element can have electrodes on its bottom surface for interconnection into a larger electrical system; alternatively, one or more optionally connectorized input/output cables can be used to collect the energy generated by the photovoltaic element(s). The photovoltaic roofing element also includes an encapsulant layer 1870 disposed over the exposure area, covering both the photovoltaic elements and the exposed inactive regions of the exposure area. The encapsulant layer can be embossed in the inactive regions so that the roofing substrate is visible. The encapsulant layer can be, for example, a fluoropolymer such as an ethylene-tetrafluoroethylene copolymer (e.g., TEFZEL), and can be bound to rest of the device with a layer of poly(ethylene-co-vinyl acetate). The encapsulant layer can optionally extend into the headlap area. Such devices are described in more detail in U.S. Pat. Nos. 5,575,861 and 5,437,735, each of which is hereby incorporated herein by reference in its entirety. In the devices described therein, for example, the distance $W_T$ can be about eight inches, as described above, and/or the distance $W_S$ can be about eighteen inches, as described above. In certain such devices, no actual cut-out tabs are provided on the roofing substrate; rather the encapsulant was embossed between laterally adjacent photovoltaic elements to simulate the appearance of tabs. Notably, according to the present invention, such devices can be formed with roofing substrates having height "H" of about eighteen inches, as described above. Moreover, according to the present invention, such devices can be formed with roofing substrates having exposure area height "E" of about eight inches, and/or photovoltaic elements having height "P" of about eight inches, as described above.

Figure 19:
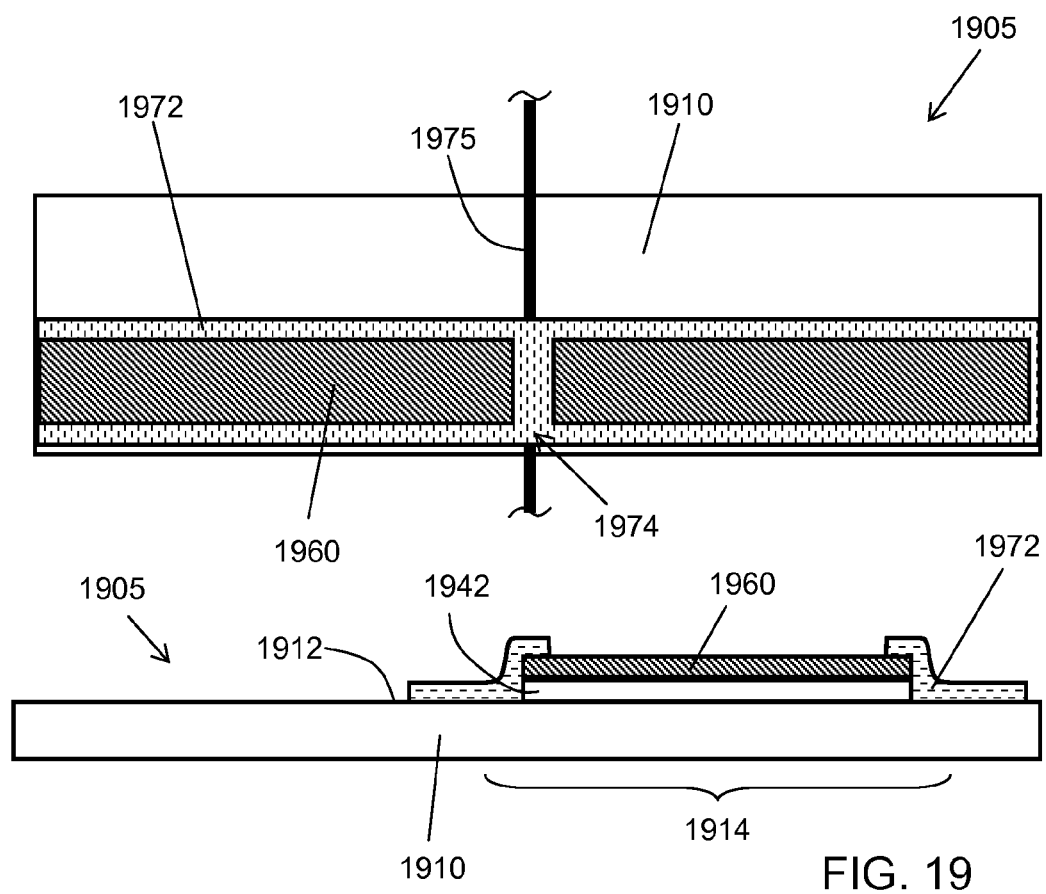
FIG. 19 is a top schematic view and a schematic cross-sectional view of a photovoltaic roofing element according to another embodiment of the invention.

In certain embodiments, a cap layer is disposed on the flexible roofing substrate. For example, as shown in schematic top view and in schematic cross-sectional view in FIG. 19, a cap layer can be disposed on the flexible roofing substrate to cover areas of the granule-coated zone in which a photovoltaic element is not disposed. In the photovoltaic roofing element 1905 of FIG. 19, flexible roofing substrate 1910 has a granule-coated zone 1914 on its top surface 1912. Affixed in the granule-coated zone (through adhesive layer 1942), but not covering it completely, are two photovoltaic elements 1960. Cap layer 1972 is disposed on top surface 1912 of flexible roofing substrate 1910 to cover certain areas of the granule-coated zone 1914 in which a photovoltaic element 1960 is not disposed. The cap layer can optionally cover all exposed area of the granule-coated zone. As shown in FIG. 19, a cap layer can also cover electrical connections (e.g., electrical connections 1974 to electrical cable 1975), thereby protecting them from the elements. Notably, a cap layer can cover electrical connections and/or wiring systems even when it is not used to cover exposed areas of a granule-coated zone. In other embodiments, a cap layer can seal the edges of a joint between the photovoltaic element(s) and the flexible roofing substrate, whether or not the photovoltaic element(s) cover the entire granule-coated zone, and whether or not the cap layer covers the entire granule-coated zone. For example, as shown in FIG. 19, cap layer 1972 seals the joint between the flexible roofing substrate 1910 and the photovoltaic elements 1960. The cap layer can be provided in individual pieces (e.g., tape-shaped strips), or as a single piece. For example, in certain embodiments, the cap layer can be provided as a single piece with cutout areas to expose the photovoltaically active areas of the photovoltaic elements. The cap layer can be provided, for example, as roofing membrane (e.g., self-adhesive, such as that available from Certain-Teed Corporation), shingle material, or other materials, and can be itself coated with roofing granules. The cap layer can alternatively be provided as a roof coating. Such roof coatings are known in the art, and can also provide other attributes to the roof, such as reflectivity of solar radiation. Coatings can be formed, for example, from acrylic or fluorinated polymers, or latex-based materials. A cap layer can cover one or more photovoltaic roofing elements.

Figure 20:
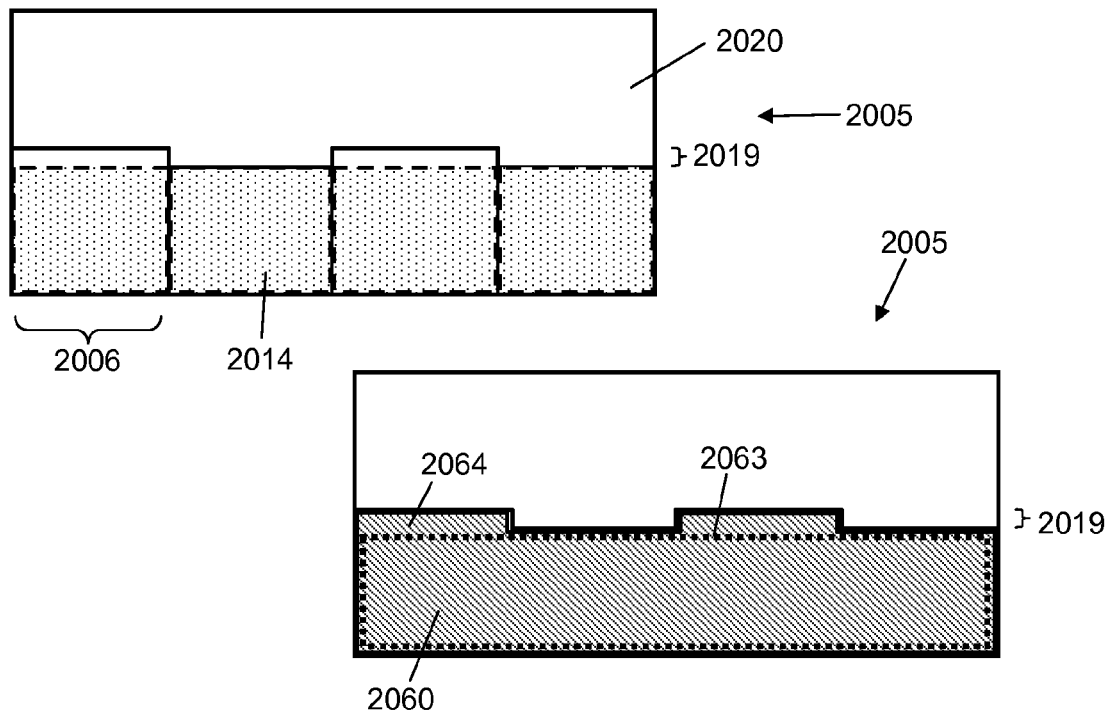
FIG. 20 is a top schematic view of a flexible roofing substrate and a photovoltaic roofing element according to another embodiment of the invention.

Another embodiment of a photovoltaic roofing element 2005 is shown in top schematic view in FIG. 20. A flexible roofing substrate 2010 has four tabs 2006, each having a granule-coated zone 2014, and a mechanical attachment zone 2019. A shim 2020 at the top surface of the roofing substrate has cutouts at two of the tabs, such that the shim has no material in the fastening zone adjacent two of the tabs. A photovoltaic module 2060 having an active area 2063 is adhered to the granule-coated zones, and has inactive extensions 2064 that lie in the cutout areas of the shim. These extensions can provide a mechanical attachment area for the photovoltaic element, and moreover can provide an alignment feature for the installation of the photovoltaic element on the flexible roofing substrate. When installed, the cutout areas can be covered by an overlying flexible roofing substrate, thereby protecting the mechanical attachment of the photovoltaic element.

Photovoltaic roofing elements of the present invention can be fabricated using many techniques familiar to the skilled artisan. Roofing substrates can be made using a variety of techniques. For example, when the roofing substrate is an asphalt shingle or an asphalt non-woven glass reinforced laminate, the person of skill in the art can use methods described in U.S. Pat. Nos. 5,953,877; 6,237,288; 6,355,132; 6,467,235; 6,523,316; 6,679,308; 6,715,252; 7,118,794; U.S. Patent Application Publication 2006/0029775; and International Patent Application Publication WO 2006/121433, each of which is hereby incorporated herein by reference in its entirety. Photovoltaic roofing elements can be fabricated in a continuous process and then cut into individual elements as is done in the fabrication of asphalt shingles. When a continuous process is used, it can be necessary to individually prepare any electrical cables running between elements, for example by cutting the cables between elements and adding connectors to the cut ends.

In certain embodiments, the present invention may also be practiced using techniques described in U.S. Patent Application Publication nos. 2005/0072456 and 2004/0144043, and in U.S. Pat. No. 4,860,509, each of which is hereby incorporated herein by reference in its entirety.

In another aspect of the invention, a photovoltaic roofing system comprises one or more photovoltaic roofing elements as described herein disposed on a roof deck. The photovoltaic roofing elements can be disposed with a certain amount of overlap to provide a waterproof covering, as is conventional in the roofing arts. The photovoltaic roofing system can include a wiring system as described above, or as described in U.S. Patent Application Publication no. 2008/0271774 A1, which is hereby incorporated herein by reference in its entirety. The photovoltaic elements of the photovoltaic roofing elements are desirably connected to an electrical system, either in series, in parallel, or in series-parallel, as would be recognized by the skilled artisan. Electrical connections can be made using electrical connectors, such as those available from Tyco International, and those described in U.S. Patent Application Publication no. 2010/0105238, which is hereby incorporated herein by reference in its entirety. There can be one or more layers of material, such as underlayment, between the roof deck and the photovoltaic roofing elements of the present invention. The photovoltaic roofing elements of the present invention can be installed on top of an existing roof; in such embodiments, there would be one or more layers of standard (i.e., non-photovoltaic) roofing elements (e.g., asphalt coated shingles or membrane roofing) between the roof deck and the photovoltaic roofing elements of the present invention. Electrical connections are desirably made using cables, connectors and methods that meet UNDERWRITERS LABORATORIES and NATIONAL ELECTRICAL CODE standards. Even when the photovoltaic roofing elements of the present invention are not installed on top of preexisting roofing materials, the roof can also include one or more standard roofing elements, for example to provide weather protection at the edges of the roof, or in any hips, valleys, and ridges of the roof, or in areas not suitable for photovoltaic power generation.

Figure 21:
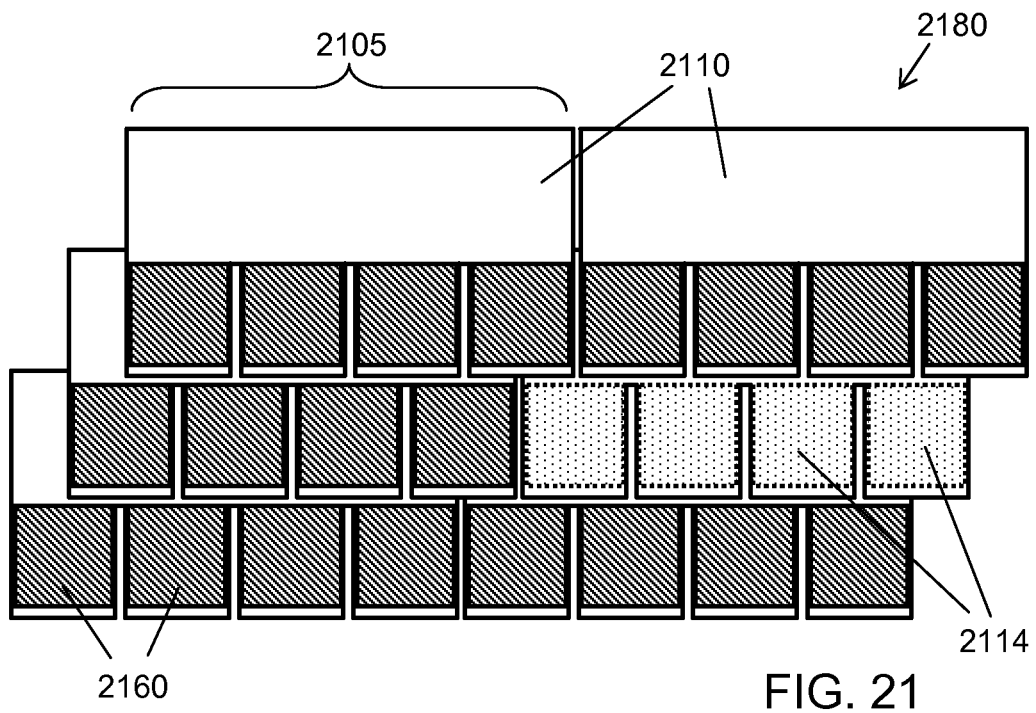
FIG. 21 is a top schematic view of a photovoltaic roofing system according to one embodiment of the invention.

Photovoltaic roofing elements based on shingles can be arrayed on a roof deck in a variety of ways. For example, in the photovoltaic roofing system 2180 shown in top schematic view in FIG. 21, photovoltaic roofing elements 2105 are arrayed as laterally-offset courses of shingles. Each flexible roofing substrate 2110 is a four-tab shingle, with a granule-coated zone 2114 (shown exposed on one shingle) on each tab. Photovoltaic elements 2160 are disposed in the granule-coated zones 2114 and adhered with adhesive (not shown). In one example, a shingle similar to the Grand Manor® Shangle®, available from CertainTeed Corporation, has a shingle exposure height of 8 inches and an overall shingle dimension of 18 inches by 36 inches, with four tabs in the exposure area. An encapsulated T-cell photovoltaic element (Uni-Solar Ovonic) equipped with a pressure-sensitive adhesive is attached to each of the granule-coated zones of each shingle. In other embodiments, for example when the shingle has one or more granule-coated zones having a height of about eight inches, an exposure area having a height of about eight inches, or both, a photovoltaic element having a height of about eight inches can be attached to each of the granule-coated zones of each shingle, or span the granule-coated zones of two or more of the tabs of each shingle.

Figure 22:
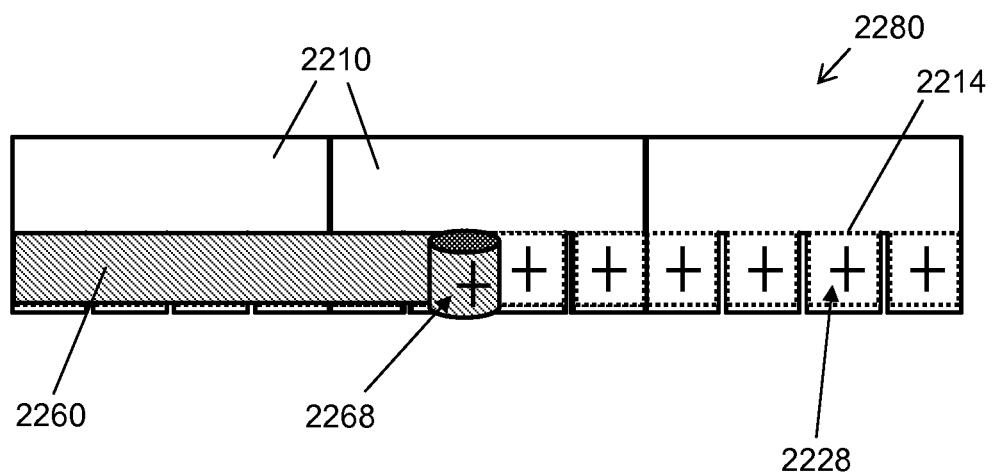
FIG. 22 is a top schematic view of a photovoltaic roofing system according to another embodiment of the invention.

In certain embodiments, in shingles similar to those described above, the granule-coated zone(s) spans the length of the exposed area of each shingle. The shingles can be applied (e.g., in a typical fashion) by a roofing professional, who need not have any particular expertise with respect to photovoltaic systems. One or more extended length photovoltaic elements can then be disposed in the granule-coated zones as described above, spanning the length of a plurality of shingles. For example, the Centennial Slate™ shingle or Hatteras® shingle exposure height of 8 inches could be entirely covered by the photovoltaic element (i.e., with a photovoltaic element having a height of about eight inches). In the photovoltaic roofing system 2280 shown in FIG. 22, a course of three shingles 2210 is arrayed on a roof deck. The shingles have granule-coated zones 2214, which include alignment marks 2228 as described above. The photovoltaic element 2260 is provided as a strip, in roll form, and has alignment marks 2268 on its bottom surface. As the photovoltaic element is unrolled and disposed on the granule-coated zones, the installer can align the alignment marks on the photovoltaic element with those on the granule-coated zone to ensure proper placement. Of course, alignment marks or features could alternatively (or also) be provided on the releasable liner. In other embodiments, alignment marks or features could be at other locations on the shingle, within the granule-coated zone, and/or on the photovoltaic element itself. In certain embodiments, the photovoltaic element can have lines or other decorative effects of a dimension that would correspond to the aesthetics of surrounding conventional shingles on the roof. While FIG. 22 shows a single photovoltaic element extending along shingles arrayed in a single dimension, in other embodiments, a single photovoltaic element can be disposed on shingles in a two-dimensional array (i.e., both across the roof and up the roof).

In certain photovoltaic roofing systems of the invention, at least about 70%, at least about 80%, or even at least about 90% of the total granule-coated zone area of the flexible roofing substrates is covered by photovoltaic elements.

Figure 23:
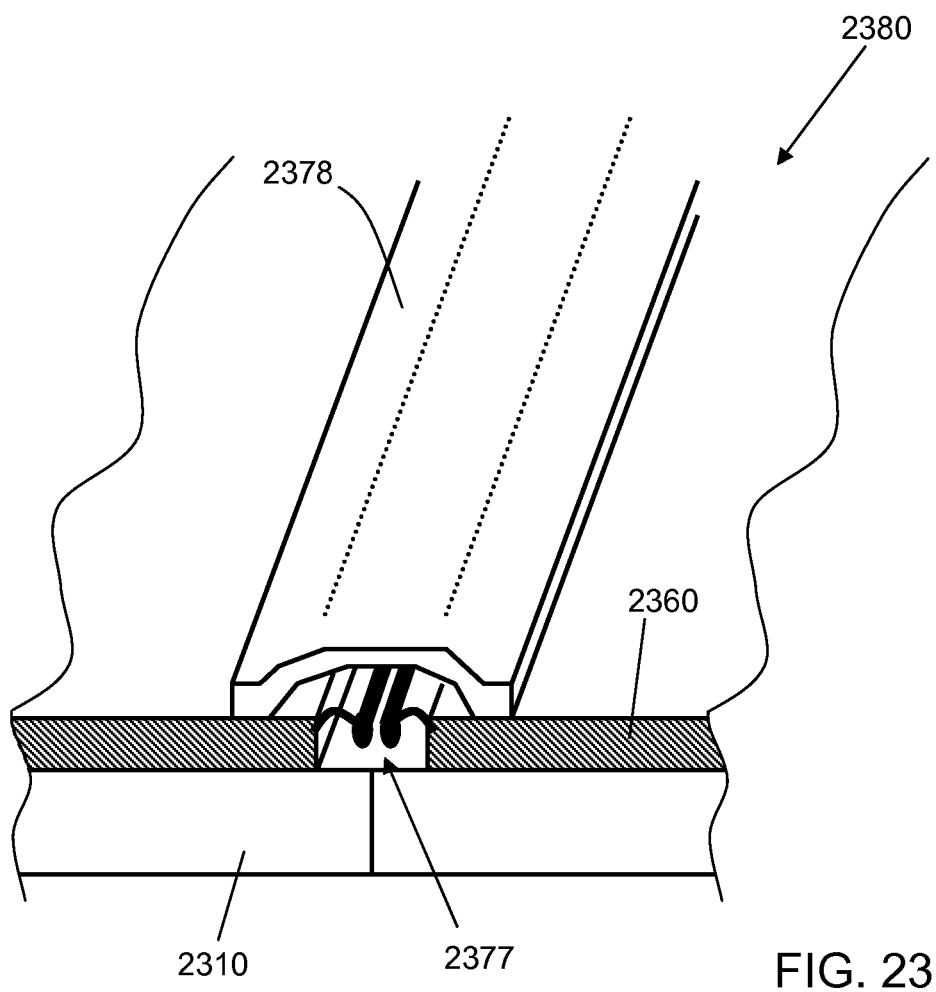
FIG. 23 is a schematic perspective view of a photovoltaic roofing system according to another embodiment of the invention.

In certain embodiments, a protective conduit covers the wiring interconnecting the photovoltaic elements, thereby protecting it from the elements, for example as shown in FIG. 23. In the photovoltaic roofing system 2380 shown in partial schematic cross-sectional/perspective view FIG. 23, the conduit 2378 is at the junction of two adjacent roofing membranes 2210, and covers wiring system 2377 that interconnects photovoltaic elements 2360. In other embodiments, the conduit can be disposed in the middle part of a membrane (e.g., between the connectorized ends of the horizontally-arranged photovoltaic elements). Of course, a conduit can also be used with a shingle-based photovoltaic roofing system. The conduit can, for example, be similar in structure to a wire covering product such as is commonly used for covering wires or cables on floors in office environments. Of course, the conduit can take any of a number of other forms, such as round or rectangular tube. A cap layer (e.g., protective tape or cover sheet) comprising a suitable roof covering material can also be applied over a conduit so as to provide a desired aesthetic effect or weathering protection to the conduit. A cap layer can also or alternatively be disposed within the conduit to provide further protection.

Figure 24:
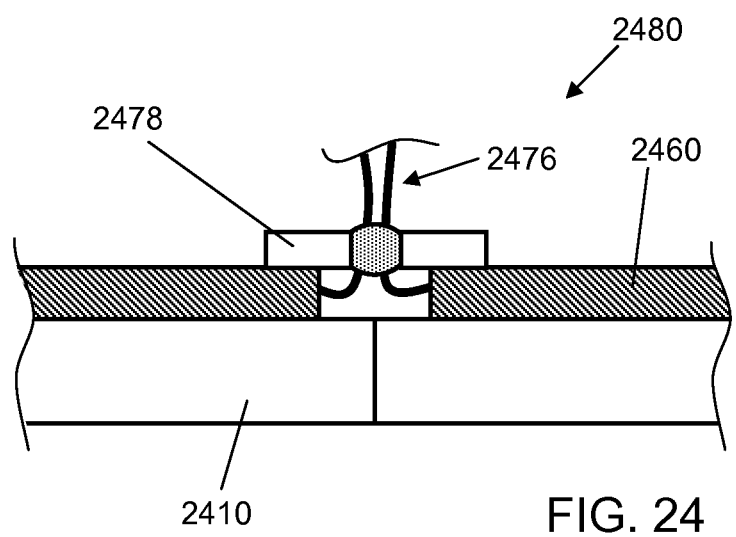
FIG. 24 is a top cross-sectional view of a photovoltaic roofing system according to another embodiment of the invention.

In another embodiment, a protective covering is disposed over the electrical connections. As shown in partial schematic cross-sectional view in FIG. 24, the protective covering can have holes formed therein near the electrical connections of the photovoltaic elements, so that wires for connection to an electrical system can pass through the holes to a wiring system for collection of the power generated by the photovoltaic elements. In the photovoltaic roofing system 2480 of FIG. 24, the protective cover 2478 covers cables 2476 that interconnect photovoltaic elements 2460 (disposed on roofing membranes 2410) into a wiring system. The holes can be sealed with an appropriate adhesive or sealant, such as a butyl, a mastic, or a neoprene adhesive. The wiring system can be provided in a conduit, which can be mounted within the roofing system and covered by a conventional roofing material strip or tape. Alternatively, the conduit can be mounted above the surface of the roof in the vicinity of the electrical connections of the photovoltaic elements. For example, a conduit could be provided as a tube of any desired geometry) supported on legs which have pitch pockets filled with tar, adhesive, caulk, or the like to accommodate dimensional changes or vibrational effects experienced during use, this minimizing transfer of forces to the wiring system.

In other embodiments, individual photovoltaic elements are electrically interconnected in series, with sets of series-connected photovoltaic elements being connected to a wiring system or a bus system (e.g., within a conduit) along one or more edges of a roof section.

Another aspect of the invention is a kit for the installation of a photovoltaic roofing system, the kit comprising one or more flexible roofing substrates as described above; and the adhesive as described above. In certain embodiments, the kit includes one or more photovoltaic elements suitable for disposition on the adhesive when the adhesive is disposed in one or more of the granule-coated zones on the top surface of the flexible roofing substrate. In other embodiments, the kit includes one or more photovoltaic elements having on their bottom surfaces an adhesive suitable for adhering the photovoltaic elements to the flexible roofing substrates. The one or more photovoltaic elements can be selected to be compatible, both in size and in adhesive characteristics as described above, with the flexible roofing substrates. Accordingly, in certain embodiments, the one or more photovoltaic elements have a height of about eight inches. The one or more flexible roofing substrates can have, for example, one or more granule-coated zones having a height of about eight inches; an exposure area having a height of about eight inches; or both. In other embodiments, the kit does not include photovoltaic elements. Such a kit can be useful for the person of skill in the art, because it allows the photovoltaic elements to be selected for the particular application desired by the end user. The person of skill in the art can customize the application of the adhesive to the flexible roofing substrates after the photovoltaic elements are selected.

Another aspect of the invention is a method for installing a photovoltaic roofing system as described above on a roof deck. First, a flexible roofing substrate as described above is installed on the roof deck. Then, on at least a portion of the granule-coated zones an adhesive suitable for securing a photovoltaic element to one or more of the granule-coated zones is disposed. Then, one or more photovoltaic elements are disposed on the adhesive on the one or more granule-coated zones, thereby adhering the photovoltaic elements to the flexible roofing substrate. When installing multiple flexible roofing substrates and/or photovoltaic elements, the person of skill in the art can perform the steps in any convenient order. For example, all (or a substantial number) of the flexible roofing substrates can be installed on the roof before any adhesive is applied. In fact, the flexible roofing substrates can remain on the roof for some time (e.g., at least an hour, at least a day, or even at least a week) before the adhesive is applied. The flexible roofing substrates can be installed robustly in a rugged manner to cover the roof; this step can be performed by a roofing professional, who need not have any particular expertise with respect to photovoltaic systems. The adhesive can be applied to a plurality of granule-coated zones before any photovoltaic elements are adhered thereto. For example, an installer can apply adhesive to a few rows of flexible roofing substrates at a time, then adhere photovoltaic elements to the applied adhesive, before moving down the roof to the next few rows of flexible roofing substrates. Of course, in other embodiments, the photovoltaic element can be adhered to the adhesive immediately after it is applied to the granule-coated zone.

Another aspect of the invention is a method for installing a photovoltaic roofing system as described above on a roof deck. First, a flexible roofing substrate as described above is installed on the roof deck. Then a photovoltaic element having an adhesive on its bottom surface is provided. The adhesive of the photovoltaic element is disposed on at least a portion of the granule-coated zones, thereby adhering the photovoltaic elements to the flexible roofing substrate. In certain embodiments according to this aspect of the invention, a photovoltaic element with a peel-and-stick adhesive on its bottom surface can be adhered directly on a granule-coated zone of an already-installed flexible roofing substrate.

Another benefit derived in certain embodiments of the invention is that when photovoltaic elements are separately installed on a roof, it is possible to test the performance of the photovoltaic elements before they are installed on the roof. Such testing can be performed, for example, immediately prior to attachment, so that any faulty photovoltaic elements are discovered before they are attached to the flexible roofing substrate.

The flexible roofing elements can be applied to the roof deck in bottom-up manner (i.e., from the lower edge of the roof to the upper edge), as is conventional. The photovoltaic elements can then be installed, for example, from the top of roof to the bottom. Top-down installation of the photovoltaic elements can allow the more fragile and potentially slippery photovoltaic elements to be applied in a more gentle manner, and without the need for an installer to walk on already-installed photovoltaic elements. Moreover, top-down installation of the photovoltaic elements can allow the adhesion of the photovoltaic elements to the roofing substrates to build over time, without the potential of being disturbed by an installer walking on or otherwise disturbing them. Of course, the photovoltaic elements can be installed in any other convenient order.

Another aspect of the invention provides a method for installing a photovoltaic roofing system on a roof deck that already has disposed thereon at least one flexible roofing substrate having a top surface, the top surface having one or more granule-coated zones thereon capable of acting as a receptor zone or an exposure zone, each zone being adapted to receive one or more photovoltaic elements, as described above. The method includes disposing on at least a portion of the granule-coated zones an adhesive suitable for securing a photovoltaic element to one or more of the granule-coated zones. Then, one or more photovoltaic elements are disposed on the adhesive on the one or more granule-coated zones, thereby adhering the photovoltaic elements to the flexible roofing substrate. The method steps can be performed as described above. This aspect of the invention allows the person of skill in the art to retrofit existing roofing elements with a photovoltaic system.

Another aspect of the invention provides a method for installing a photovoltaic roofing system on a roof deck that already has disposed thereon at least one flexible roofing substrate having a top surface, the top surface having one or more granule-coated zones thereon capable of acting as a receptor zone or an exposure zone, each zone being adapted to receive one or more photovoltaic elements, as described above. The method includes providing a photovoltaic element having an adhesive on its bottom surface; and disposing the adhesive on at least a portion of the granule-coated zones, thereby adhering the photovoltaic elements to the flexible roofing substrate. The method steps can be performed as described above. This aspect of the invention allows the person of skill in the art to retrofit existing roofing elements with a photovoltaic system.

In other embodiments, the adhesive is applied to the flexible roofing substrate before the flexible roofing substrate is installed on the roof. For example, the adhesive can be disposed on the flexible roofing substrate at the worksite, but before installation. This can allow the individual materials to be transported more efficiently, and be put together to fit the particular dimensions of the roof. In other embodiments, the adhesive can be disposed on the flexible roofing substrate in a factory or workshop setting. In such embodiments, the use of a flexible roofing substrate with a granule-coated zone can increase adhesion of the photovoltaic roofing element without sacrificing properties of the rest of the flexible roofing substrate, and can increase process flexibility during manufacture. For example, in some embodiments, the adhesive is applied only after the selection of a photovoltaic element for use in the system is finalized. Accordingly, the person of skill can adapt stock flexible roofing elements and adhesives for use with any desired photovoltaic element.

Figure 25:
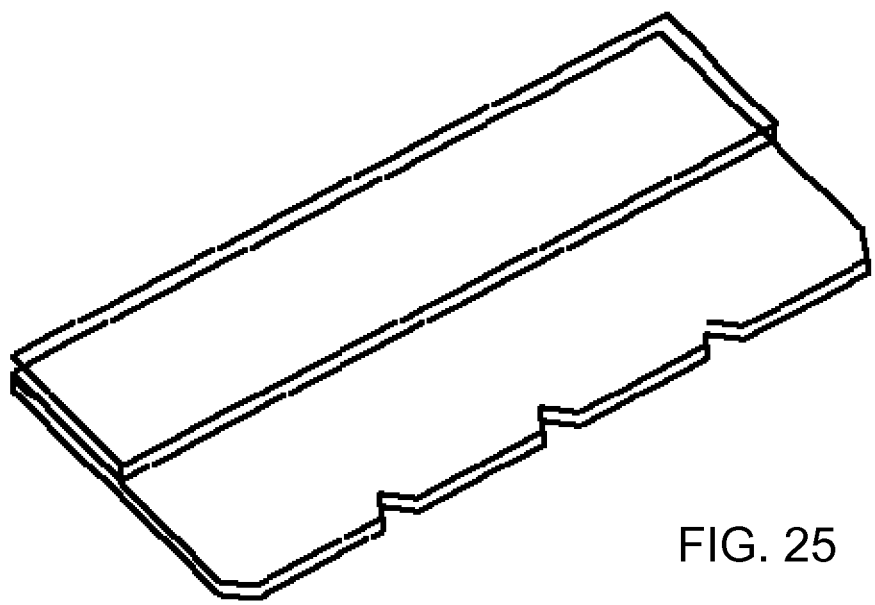
FIGS. 25-28 are schematic perspective views of flexible roofing elements and photovoltaic roofing elements according to one embodiment of the invention.
Figure 26:
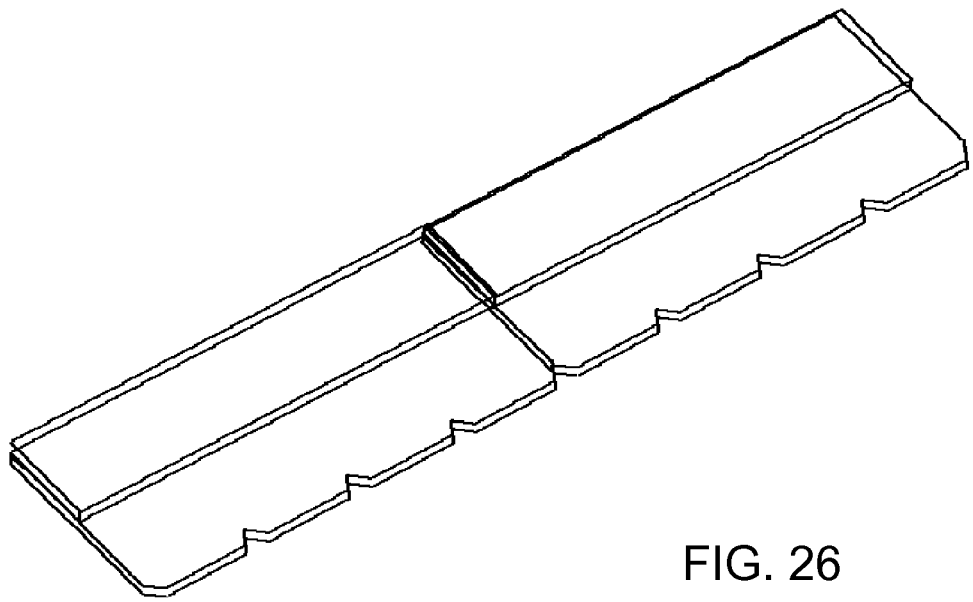
Figure 27:
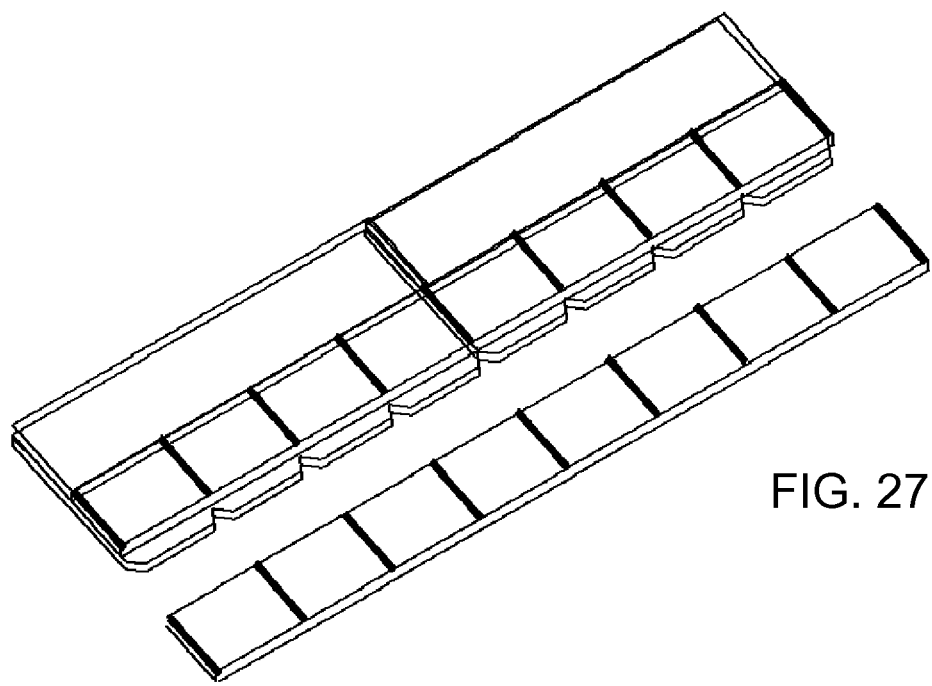
Figure 28:
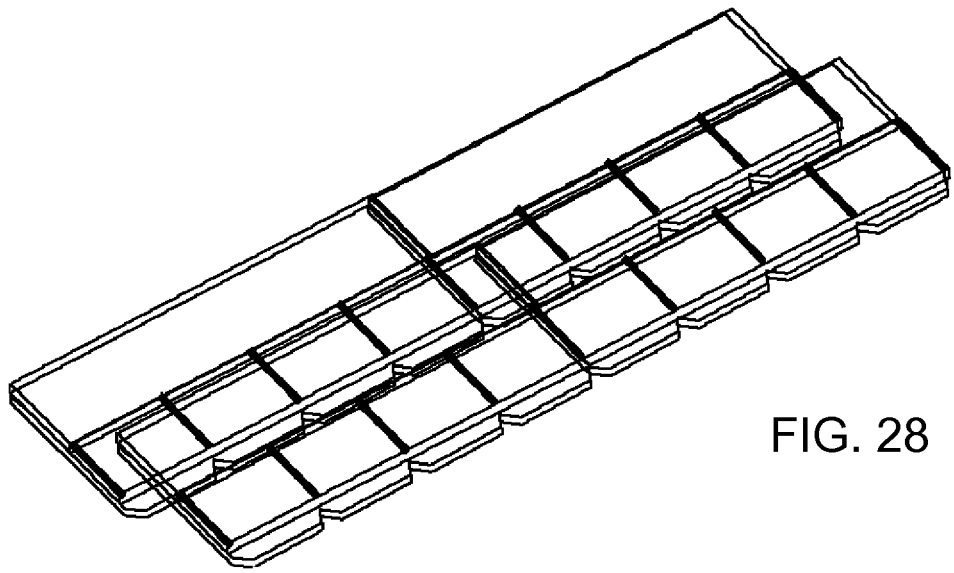

A selection of sample drawings of various embodiments of the invention is provided in FIGS. 25-28. FIG. 25 is a perspective view of a shingle having a base layer of shingle material, granule coated in its exposure area, and a shim in the headlap zone of the shingle. As described above, the top face shim in the headlap region creates thickness to balance the dimensions of a photovoltaic element. FIG. 26 is a perspective view of two such shingles applied side by side (e.g., in a single course on a roof). The optional top face shim, as described above, allows flexibility for use of slightly thicker photovoltaic elements while still providing a downward flow of water over the roof surface. FIG. 27 is a perspective view of a photovoltaic element adhered in the granule-coated zones of the shingles of FIG. 25 (along with a schematic depiction of a photovoltaic element). The photovoltaic elements of FIG. 27 include lines that match the periodicity of the tabs in the shingles of FIG. 25. FIG. 28 shows a second course of shingles applied on a roof and equipped with photovoltaic elements as described above.

It will be apparent to those skilled in the art that various modifications and variations can be made to the present invention without departing from the scope of the invention. Thus, it is intended that the present invention cover the modifications and variations of this invention provided they come within the scope of the appended claims and their equivalents.

What is claimed is:

1. A photovoltaic roofing element comprising:
a roofing product comprising
a flexible roofing substrate having a top surface, the top surface having one or more granule-coated zones thereon capable of acting as a receptor zone or an exposure zone, each zone being adapted to receive one or more photovoltaic elements, the top surface further comprising a headlap zone and one or more inactive zones adjacent the one or more granule-coated zones and not covered when the photovoltaic roofing element is installed, the one or more inactive zones being coated with granules, the top surface of the flexible roofing substrate in the one or more granule-coated zones is recessed from the top surface of the flexible roofing substrate in the one or more inactive zones; and
an adhesive suitable for securing photovoltaic elements to one or more of the granule-coated zones, the adhesive capable of forming a bond to the granules and the top surface of the flexible roofing substrate and to the bottom surface of the photovoltaic elements,
with the adhesive disposed in one or more of the granule-coated zones but not in the inactive zones; and
one or more photovoltaic elements disposed on the adhesive in the one or more granule-coated zones of the top surface of the flexible roofing substrate.

2. The photovoltaic roofing element of claim 1, wherein at least some of the granule-coated zones remain exposed as exposure zones.

3. The photovoltaic roofing element according to claim 1, wherein a mechanical fastener is used together with the adhesive in the attachment of the photovoltaic elements to the flexible roofing substrate.

4. The photovoltaic roofing element according to claim 3, wherein the photovoltaic element includes a fastening zone or one or more fastening tabs.

5. The photovoltaic roofing element according to claim 1, wherein more than one photovoltaic element is disposed on each granule-coated zone.

6. A photovoltaic roofing system comprising one or more photovoltaic roofing elements according to claim 1.

7. A method for installing a photovoltaic roofing system according to claim 6, the method including:
installing on a roof deck a flexible roofing substrate having a top surface, the top surface having one or more granule-coated zones thereon capable of acting as a receptor zone or an exposure zone, each zone being adapted to receive one or more photovoltaic elements; then disposing on at least a portion of the granule-coated zones an adhesive suitable for securing a photovoltaic element to one or more of the granule-coated zones, the adhesive being capable of forming a bond to the granules and the top surface of the flexible roofing substrate; then disposing one or more photovoltaic elements on the adhesive disposed in the one or more granule-coated zones of the top surface of the flexible roofing substrate, thereby adhering the photovoltaic elements to the flexible roofing substrate.

8. The method according to claim 7, wherein the roofing product is installed in a bottom-up fashion, and the photovoltaic elements are installed in a top-down fashion.

9. A method for installing a photovoltaic roofing system according to claim 6 on a roof deck, the roof deck having disposed thereon at least one flexible roofing substrate having a top surface, the top surface having one or more granule-coated zones thereon capable of acting as a receptor zone or an exposure zone, each zone being adapted to receive one or more photovoltaic elements, the method including:

disposing on a portion of the granule-coated zones an adhesive suitable for securing photovoltaic elements to one or more of the granule-coated zones, the adhesive being capable of forming a bond to the granules and the top surface of the flexible roofing substrate; then disposing one or more photovoltaic elements on the one or more granule-coated zones of the top surface of the flexible roofing substrate on which are disposed the adhesive.

10. A method for installing a photovoltaic roofing system according to claim 6, the method including:

disposing on a portion of the granule-coated zones of a flexible roofing substrate having a top surface, the top surface having one or more granule-coated zones thereon capable of acting as a receptor zone or an exposure zone, each zone being adapted to receive one or more photovoltaic elements an adhesive suitable for securing photovoltaic elements to one or more of the granule-coated zones, the adhesive being capable of forming a bond to the granules and the top surface of the flexible roofing substrate; then installing on a roof deck the flexible roofing substrate having the adhesive disposed thereon; then disposing one or more photovoltaic elements on the one or more granule-coated zones of the top surface of the flexible roofing substrate on which are disposed the adhesive.

11. A method for installing a photovoltaic roofing system according to claim 6 on a roof deck, the method comprising:

installing on the roof deck a flexible roofing substrate having a top surface, the top surface having one or more granule-coated zones thereon capable of acting as a receptor zone or an exposure zone, each zone being adapted to receive one or more photovoltaic elements an adhesive suitable for securing photovoltaic elements to one or more of the granule-coated zones;

providing a photovoltaic element having an adhesive on its bottom surface; and then disposing the adhesive on at least a portion of the granule-coated zones, thereby adhering the photovoltaic element to the flexible roofing substrate.

12. A photovoltaic roofing element according to claim 1, wherein the granules of the one or more granule-coated zones are different from the granules of the one or more inactive zones.

13. A photovoltaic roofing element according to claim 1, wherein the flexible roofing substrate further comprises a shim disposed on the headlap zone, the shim having sufficient thickness so that the top surface plane of an overlying photovoltaic roofing element disposed on the shim is at or above the level of the top surface of the one or more photovoltaic elements.

* * * * *